US011822242B2

(12) United States Patent
Liu et al.

(10) Patent No.: US 11,822,242 B2
(45) Date of Patent: Nov. 21, 2023

(54) DNQ-TYPE PHOTORESIST COMPOSITION INCLUDING ALKALI-SOLUBLE ACRYLIC RESINS

(71) Applicant: Merck Patent GmbH, Darmstadt (DE)

(72) Inventors: Weihong Liu, Branchburg, NJ (US); Ping-Hung Lu, Bridgewater, NJ (US); Chunwei Chen, Whitehouse Station, NJ (US); Medhat A. Toukhy, Flemington, NJ (US)

(73) Assignee: Merck Patent GmbH, Darmstad (DE)

( * ) Notice: Subject to any disclaimer, the term of this patent is extended or adjusted under 35 U.S.C. 154(b) by 12 days.

(21) Appl. No.: 17/762,589

(22) PCT Filed: Nov. 12, 2020

(86) PCT No.: PCT/EP2020/081853
§ 371 (c)(1),
(2) Date: Mar. 22, 2022

(87) PCT Pub. No.: WO2021/094423
PCT Pub. Date: May 20, 2021

(65) Prior Publication Data
US 2022/0357658 A1    Nov. 10, 2022

Related U.S. Application Data

(60) Provisional application No. 62/935,352, filed on Nov. 14, 2019.

(51) Int. Cl.
*G03F 7/022* (2006.01)
*G03F 7/023* (2006.01)
*G03F 7/30* (2006.01)
*C08F 220/18* (2006.01)
*C08F 220/28* (2006.01)

(52) U.S. Cl.
CPC ...... *G03F 7/0233* (2013.01); *C08F 220/1804* (2020.02); *C08F 220/1807* (2020.02); *C08F 220/281* (2020.02); *G03F 7/0226* (2013.01); *G03F 7/30* (2013.01)

(58) Field of Classification Search
CPC .... G03F 7/0226; G03F 7/0233; G03F 7/0236; G03F 7/30
See application file for complete search history.

(56) References Cited

U.S. PATENT DOCUMENTS

| | | |
|---|---|---|
| 3,900,325 A | 8/1975 | Christensen et al. |
| 4,093,464 A | 6/1978 | Ruckert et al. |
| 4,472,494 A | 9/1984 | Hallman et al. |
| 4,571,374 A | 2/1986 | Vikesland |
| 5,561,194 A | 10/1996 | Cornett et al. |
| 5,866,295 A | 2/1999 | Oberlander et al. |
| 5,876,897 A | 3/1999 | Durham et al. |
| 5,942,369 A | 8/1999 | Ota et al. |
| 2002/0045123 A1 | 4/2002 | Okubo et al. |
| 2003/0059706 A1 | 3/2003 | Misumi et al. |
| 2003/0194635 A1 | 10/2003 | Mulligan |
| 2006/0141388 A1 | 6/2006 | Okui et al. |
| 2007/0042604 A1* | 2/2007 | Ahn ............... C08F 220/1806 438/689 |
| 2009/0291393 A1 | 11/2009 | Misumi et al. |
| 2013/0337380 A1 | 12/2013 | Liu et al. |
| 2014/0154624 A1 | 6/2014 | Liu et al. |
| 2015/0024173 A1* | 1/2015 | Tahara ............... G03F 7/0384 430/286.1 |
| 2015/0160554 A1 | 6/2015 | Liu et al. |

FOREIGN PATENT DOCUMENTS

| | | |
|---|---|---|
| CA | 2067921 A1 | 12/1992 |
| DE | 2236941 A1 | 2/1974 |
| DE | 3528930 A1 | 2/1987 |
| DE | 270785 A1 | 8/1989 |
| DE | 3811242 A1 | 10/1989 |
| DE | 10063066 A1 | 6/2001 |
| EP | 0337188 A1 | 10/1989 |
| EP | 0212439 B1 | 5/1990 |
| EP | 0855620 A1 | 7/1998 |
| EP | 1111084 A1 | 6/2001 |
| EP | 1437232 A2 | 7/2004 |
| EP | 1577111 A1 | 9/2005 |
| EP | 2861638 B1 | 11/2018 |
| FR | 2258651 A2 | 8/1975 |
| JP | H05-114673 A | 5/1993 |

(Continued)

OTHER PUBLICATIONS

Cheng et al., "Synthetic study and material applications for a positive photo resist of the acrylic series", Materials Letters vol. 57 No. 3, Dec. 2002, pp. 753-760.
Gallagher-Wetmore et al., "Supercritical fluid processing: a new dry technique for photoresist developing", The International Society for Optical Engineering, Advances in Resist Technology and Processing XII. vol. 2438. SPIE, Jun. 9, 1995, pp. 694-708.
Koukharenko et al., "A comparative study of different thick photoresists for MEMS applications", Journal of Materials Science: Materials in Electronics vol. 16 No. 11, 2005, pp. 741-747.
May et al., "Investigating 248 and 193 nm resist degradation during reactive ion oxide etching", Microelectronic Engineering, 83(4-9), Feb. 21, 2006, pp. 1098-1102.
International Search Report and Written Opinion received for PCT Application No. PCT/EP2020/081853, dated Feb. 17, 2021, 11 Pages.

*Primary Examiner* — John S Chu
(74) *Attorney, Agent, or Firm* — Francis M. Houlihan

(57) ABSTRACT

Describe herein is a composition comprising: an acrylic polymer comprising repeat units selected from ones having structure (1), (2), (3), (4), (5), (6), and (7) wherein these repeat units are present in said acrylic polymer in the mole % ranges as described herein; a Novolak resin having a dissolution rate in 0.26 N aqueous TMAH of at least 50 Å/sec; a diazonaphthoquinone (DNQ) photoactive compound (PAC); and an organic spin casting solvent, and a process of using said composition as a positive photoresist developable in aqueous base.

19 Claims, 3 Drawing Sheets

(56) References Cited

FOREIGN PATENT DOCUMENTS

| | | |
|---|---|---|
| JP | H05-287222 A | 11/1993 |
| JP | H06-313134 A | 11/1994 |
| JP | H08-202038 A | 8/1996 |
| JP | H08-236434 A | 9/1996 |
| JP | H08-272089 A | 10/1996 |
| JP | H09-302500 A | 11/1997 |
| JP | H10-153863 A | 6/1998 |
| JP | 2000-019738 A | 1/2000 |
| JP | 2000-029213 A | 1/2000 |
| JP | 2000-039715 A | 2/2000 |
| JP | 2000-039716 A | 2/2000 |
| JP | 2000-047379 A | 2/2000 |
| JP | 2000-047384 A | 2/2000 |
| JP | 2000-056450 A | 2/2000 |
| JP | 2000-056458 A | 2/2000 |
| JP | 2000-321775 A | 11/2000 |
| JP | 2000-321785 A | 11/2000 |
| JP | 2001-033965 A | 2/2001 |
| JP | 2001-142217 A | 5/2001 |
| JP | 2001-324808 A | 11/2001 |
| JP | 2002-236360 A | 8/2002 |
| JP | 2002-258479 A | 9/2002 |
| JP | 2003-156849 A | 5/2003 |
| JP | 2004-133025 A | 4/2004 |
| JP | 2004-272182 A | 9/2004 |
| JP | 2004-309775 A | 11/2004 |
| JP | 2004-309777 A | 11/2004 |
| JP | 2004-309778 A | 11/2004 |
| JP | 2009-091459 A | 4/2009 |
| JP | 2010-160419 A | 7/2010 |
| JP | 4499591 B2 | 7/2010 |
| JP | 2010-256834 A | 11/2010 |
| JP | 2011-213826 A | 10/2011 |
| JP | 2012-069316 A | 4/2012 |
| JP | 2012-220860 A | 11/2012 |
| JP | 2012-226044 A | 11/2012 |
| JP | 2013-043864 A | 3/2013 |
| JP | 2013-127517 A | 6/2013 |
| JP | 2016-040577 A | 3/2016 |
| KR | 2002-0036117 A | 5/2002 |
| KR | 10-2010-0018141 A | 2/2010 |
| KR | 10-2012-0009721 A | 2/2012 |
| KR | 10-2012-0009722 A | 2/2012 |
| WO | 01/63360 A2 | 8/2001 |
| WO | 02/21216 A2 | 3/2002 |
| WO | 03/065124 A1 | 8/2003 |
| WO | 2004/038506 A1 | 5/2004 |
| WO | 2006/101250 A1 | 9/2006 |
| WO | 2007/066661 A1 | 6/2007 |
| WO | 2008/044326 A1 | 4/2008 |
| WO | 2013/088852 A1 | 6/2013 |
| WO | 2013/118680 A1 | 8/2013 |
| WO | 2013/185989 A1 | 12/2013 |
| WO | 2014/086846 A2 | 6/2014 |
| WO | 2017/182441 A1 | 10/2017 |
| WO | 2018/029142 A1 | 2/2018 |
| WO | 2021/094423 A1 | 5/2021 |

\* cited by examiner

| Formulation Example 23 on Cu | Formulation Example 22 on Cu | Formulation Example 16 on Cu | Formulation Example 15 on Cu (comparative no acrylate) |
|---|---|---|---|
| NK280: 8 wt% solids<br>CL23F: 83.6 wt% solids<br>P4: 8.28 wt% solids | NK280: 10 wt% solids<br>CL23F: 81.6 wt% solids<br>P4: 8.28 wt% solids | NK280: 17.4 wt% solids<br>CL23F: 74.2 wt% solids<br>P4: 8.28 wt% solids | NK280: 6.1 wt% solids<br>CL23F: 82.59 wt% solids |
| 380 mJ/cm² | 400 mJ/cm² | 560 mJ/cm² | 300 mJ/cm² |
| 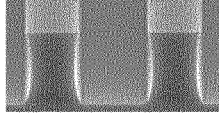 | 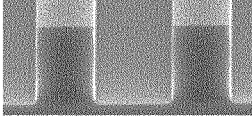 | 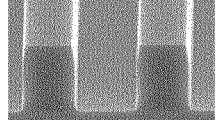 | 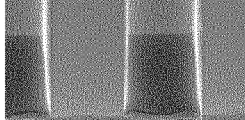 |
| L/S 1/1: 4 μm | LS 1/1: 4 μm | LS 1/1: 4 μm | LS 1/1: 4 μm |
| FT=5 μm- SB=110 °C /120sec PEB: no Develop 300MIF: 3X60sec | FT=5 μm SB=100 °C /120sec PEB: no Develop 300MIF: 3X65sec | FT=5 μm SB=110 °C /120sec PEB: 100°C/60sec Develop 300MIF: 3X60sec | FT=5 μm SB=110 °C/60 sec PEB: 110°C/60 sec Develop 300MIF: 3X60sec |

FIG. 1

| Formulation<br>Example 26 on Si | Formulation<br>Example 25 on Si | Formulation<br>Example 24 on Si |
|---|---|---|
| NK280: 8 wt% solids<br>CL23F: 86.9 wt% solids<br>P11: 5 wt% solids | NK280: 13.6 wt% solids<br>CL23F: 81.3 wt% solids<br>P11: 5 wt% solids | NK280: 16.3 wt% solids<br>CL23F: 78.58 wt% solids<br>P11: 5 wt% solids |
| 200 mJ/cm$^2$ | 400 mJ/cm$^2$ | 500 mJ/cm$^2$ |
| 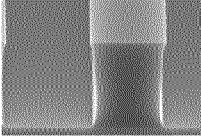 | 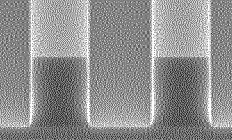 | 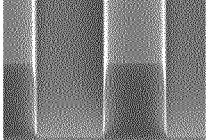 |
| LS 1/1: 4 μm | LS 1/1: 4 μm | LS 1/1: 4 μm |
| FT=5 μm -<br>SB=100°C/120sec PEB:<br>no Develop<br>300MIF: 3X60sec | FT=5 μm<br>SB=100°C/120sec<br>PEB: no<br>Develop 300MIF:<br>3X60sec | FT=5 μm<br>SB= 110°C/120 sec<br>PEB: 100°C/60sec<br>Develop 300MIF:<br>3X60sec |

FIG. 2

| Formulation Example 25 on Cu* | Formulation Example 27** on Cu |
|---|---|
| NK280: 13.6 wt% solids | NK280: 13.6 wt% solids |
| CL23F: 81.3 wt% solids | CL23F: 81.3 wt% solids |
| P11: 5 wt% solids | P11: 5 wt% solids |
| MTA: 0.027 wt% solids | MTA: not present |
| 360 mJ/cm² | 360 mJ/cm² |
| 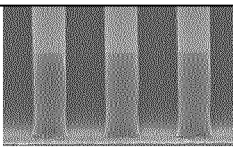 | 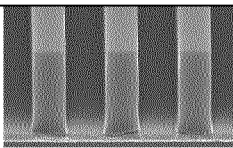 |
| LS 1/1: 2 µm | LS 1/1: 2 µm |
| FT=5 µm　　SB=100°C/120sec<br>PEB: no　　　　Develop<br>300MIF: 3X60sec | FT=5 µm　　SB=100°C/120sec<br>PEB: no　　　　Develop<br>300MIF: 3X60sec |
FIG. 3

DNQ-TYPE PHOTORESIST COMPOSITION INCLUDING ALKALI-SOLUBLE ACRYLIC RESINS

This application is a national stage application, filed under 35 U.S.C. § 371, of International Patent Application No. PCT/EP2020/081853 (filed on 12 Nov. 2020) which claims the benefit of United States Provisional Patent Application No. 62/935,352 (filed on 14 Nov. 2019) each of which applications is incorporated herein by reference in their entirety.

FIELD

The disclosed subject matter relates to materials for use in the field of photoresist imaging. More specifically, the disclosed subject matter is directed to a positive working photosensitive material that includes acrylic resins having high dissolution rates exhibiting improved photospeed, develop time, rehydration time and resolution. Among other things, the disclosed photoresist is useful for connecting terminals such as metal posts, bumps and wiring patterns for LED applications, chip size packages (CSP) and microelectronic machine systems (MEMS).

BACKGROUND

Photoresist compositions are used in microlithography processes for manufacturing miniaturized electronic components (e.g., in the fabrication of integrated circuit devices). Generally, in these processes, a coated film of a photoresist composition is applied to a substrate, such as a silicon wafer, used for making integrated circuits, circuit boards and flat panel displays. The coated substrate is then baked to evaporate any solvent in the photoresist composition and to fix the coating onto the substrate. The baked coated surface of the substrate is then subjected to an image-wise exposure to actinic radiation. Various types of actinic radiation are commonly used in microlithographic processes, including visible light, ultraviolet (UV) light, extreme ultraviolet (EUV) light, electron beam and X-ray radiant energy.

Exposure to the actinic radiation causes a chemical transformation in the exposed areas of the coated surface. After the exposure, the coated substrate is treated with a developer solution to dissolve and remove either the radiation-exposed areas (for positive-type photoresists) or the unexposed areas (for negative-type photoresists) of the coated surface of the substrate.

After the forgoing development operation, the now partially unprotected substrate may be treated with a substrate-etchant solution, plasma gases or reactive ions, or have metal/metal composites deposited in the spaces of the substrate where the photoresist coating was removed during development. The areas of the substrate where the photoresist coating is not removed remains protected. Later, the remaining areas of the photoresist coating may be removed during a stripping operation, leaving a patterned substrate surface. In some instances, it is desirable to heat treat the remaining photoresist layer, after the development step and before the etching step, to increase its adhesion to the underlying substrate.

The use of positive-working, sensitive photoresist compositions that are developable by aqueous base is known. These compositions generally relate to (i) chemically amplified photoresist based on either phenolic or (meth)acrylate resin or (ii) non-chemically amplified photoresists based on Novolak resin and diazonaphthoquinone (DNQ). In a Novolak/DNQ photoresist, a positive image is formed through the photodecomposition of the DNQ compound (or photoactive compound—PAC) which in exposed resist areas leads to faster dissolution of the Novolak resin in aqueous base. These types of photoresists are employed at longer UV wavelengths such with i-line (365 nm) and were for many years "workhorse" photoresists in the manufacturing of integrated circuits (IC).

In standard chemically amplified (CA) positive photoresist, a base soluble resin (usually a 4-hydroxy styrene phenolic resin or (meth)acrylate resin) is released in areas where the resist is exposed to radiation. The resin can be developed by aqueous base following the acid catalyzed cleavage of protecting groups on these resins that initially mask the base solubilizing moieties. In these chemically amplified photoresists, the catalytic acid is formed by photodecomposition of photo-acid generator (PAG) component. These types of resists are typically employed at shorter wavelengths in a quest for higher resolution in the manufacture of IC's. Throughput issue can occur with some standard chemically amplified resists where the protecting group, which masks the base solubilizing moiety, require a high activation energy acid for their cleavage in order unmask the base solubilizing moiety. Thus, although these high activation energy groups are catalytically removable by acid, this removal requires a post exposure bake step, which is time consuming. Also, in high activation energy, positive chemically amplified resists, there is potential sensitivity to airborne base contamination. This sensitivity occurs because obtaining good resolution with these resists requires having a high degree of non-linearity between the extent of cleavage of the high activation energy group and dissolution of an exposed resist film. Thus, even a small depletion of acid at the surface after exposure will in the delay time between exposure and bake case a lower degree of deprotection of these groups at the surface which will manifest itself as an insoluble resist surface layer. This post-exposure delay effect is called "T-topping" because of the resulting positive images formed have a large and undesirable T-shape, which causes defects in manufacturing and lower device yields.

For thick film applications, conventional Novolak/DNQ resists these produce sloped profiles, particularly as the films get thicker due to their high film absorption. Positive chemically amplified resists, on the other hand, can provide adequate performance over 5-10 μm film thickness. However, the polymers conventionally used for these CA resists such as ones based on 4-hydroxystyrene, are much more expensive than conventional Novolak resins. Also, certain designs for positive CA resists, which require a post exposure bake, may have a negative effect on IC device throughput. Cost and device throughput are also an issue for applications pertaining to the manufacture of displays even though the thickness requirements for the resists in such applications are often lower (e.g., 1 μm to 3 μm). Further, conventional Novolak/diazonaphthoquinone photoactive compound (DNQ-PAC)-type photoresist usually shows slow UV photo-speed and long develop times, and long rehydration times. The resolution is worse than standard chemically amplified photoresist. The sidewall profiles are sloped compared to Standard CA type photoresist. Positive-acting Novolak/DNQ photoresists dissolved in conventional spin casting solvent such as propylene glycol methyl ether acetate (PGMEA; 1-methoxy-2-propanol acetate) or propylene glycol methyl ether (PGME; 1-methoxy-2-propanol) are known. Novolak polymers may also be reacted with quinone diazides and combined with a polymer. It has been found that photoresists based on only Novolak/diazide do not have the photosensitivity or the steepness of sidewalls necessary for certain type of processes, especially for very thick films. Moreover, a high dark-film loss in the developer is often observed and such coating may have poor coating uniformity.

In contrast to the above described conventional Novolak/diazonaphthoquinone photoactive compound (DNQ-PAC)-type photoresist and standard CA photoresist, the inventive compositions described as follows, surprisingly, do not require any post exposure bake, produce straight wall L/S features, do not require a long rehydration time while and also have good UV photosensitivity.

SUMMARY

In one aspect this invention pertains to a composition comprising components a), b) c) and d) wherein, component a) is an acrylic polymer comprising repeat units selected from ones having structure (1), (2), (3), (4), (5), (6), and (7) wherein these repeat units are present in said acrylic polymer in the following mole % ranges, based on the total moles of all different repeat units present, and further where the summation of the individual mole % values for all repeat units present in said polymer must equal 100 mole %, the repeat unit of structure (1) ranges from about 10 mole % to about 35 mole %, the repeat unit of structure (2) ranges from 0 mole % to about 20 mole %, the repeat unit of structure (3) ranges from about 0 mole % to about 55 mole %, the repeat unit of structure (4) ranges from about 0 mole % to about 30 mole %, the repeat unit of structure (5) ranges from about 15 mole % to about 55 mole %, the repeat unit of structure (6) ranges from about 0 mole % to about 40 mole %, the repeat unit of structure (7) ranges from about 0 mole % to about 25 mole %, and $R_1$, $R_2$, $R_3$, $R_4$, $R_5$, $R_6$, and $R_7$ are individually selected from either H, F, a C-1 to C-4 perfluoroalkyl, or a C-1 to C-4 alkyl, $R_8$ and $R_9$ are individually selected from H, a C-1 to C-4 alkyl, a C-1 to C-4 alkyloxy alkyl, and a halogen, $R_{10}$ is a C-3 to C-8 cyclic alkyl, or a C-7 to C-14 alicyclic alkyl, $R_{11}$ is a C-2 to C-8 (hydroxy)alkylene moiety, $R_{12}$ is an acid cleavable group, $R_{13}$ is a C-3 to C-12, (alkyloxy)alkylene moiety, and wherein said acrylic polymer has a dissolution rate, of at least about 100 Å/sec and lower than about 13000 Å/sec in 0.26 N aqueous tetramethylammonium hydroxide (TMAH),

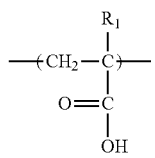

(1)

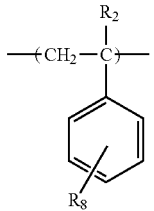

(2)

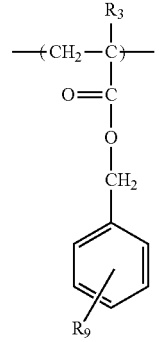

(3)

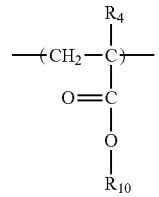

(4)

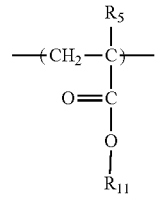

(5)

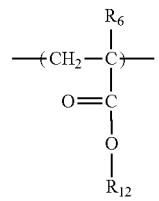

(6)

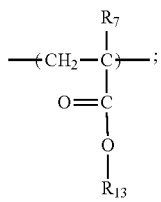

(7)

component b) is a Novolak resin having a dissolution rate in 0.26 N aqueous TMAH of at least 50 Å/sec;

component c) is a diazonaphthoquinone (DNQ) photoactive compound (PAC); and component d) is an organic spin casting solvent, and further wherein said acrylic polymer comprises about 0.5 wt % solids to about 70 wt % solids, and said DNQ PAC comprises about 5 wt % solids to about 20 wt % solids in said composition, and further wherein a coated film of said composition has a dark erosion less than 10 Å/sec in 0.26 N aqueous tetramethylammonium hydroxide (TMAH).

Another aspect of this invention is the process of using said composition as a positive photoresist imagable with UV radiation.

BRIEF DESCRIPTION OF THE DRAWINGS

The accompanying drawings, which are included to provide a further understanding of the disclosed subject matter and are incorporated in and constitute a part of this specification, illustrate embodiments of the disclosed subject matter and together with the description explain the principles of the disclosed subject matter.

FIG. 1 SEM comparison of 4 µm 1/1 L/S features for Formulation Example 23, 22, 16 and 15 on copper.

FIG. 2 SEM comparison of 4 µm 1/1 L/S features for Formulation Example 26, 25, and 24 on Silicon.

FIG. 3 SEM comparison of 2 µm 1/1 L/S features for Formulation Example 25, 27 on Copper having different level of DNQ-PAC as shown in SEM images;

DEFINITIONS

Unless otherwise stated, the following terms used in the specification and claims shall have the following meanings for the purpose of this application.

In this application, the use of the singular includes the plural, and the words "a," "an" and "the" mean "at least one," unless specifically stated otherwise. Furthermore, the use of the term "including," as well as other forms such as "includes" and "included," is not limiting. Also, terms such as "element" or "component" encompass both elements or components including one unit and elements or components that include more than one unit, unless specifically stated otherwise. As used herein, the conjunction "and" is intended to be inclusive and the conjunction "or" is not intended to be exclusive, unless otherwise indicated. For example, the phrase "or, alternatively" is intended to be exclusive. As used herein, the term "and/or" refers to any combination of the foregoing elements including using a single element.

The terms "about" or "approximately," when used in connection with a measurable numerical variable, refers to the indicated value of the variable and to all values of the variable that are within the experimental error of the indicated value (e.g., within the 95% confidence limit for the mean) or within ±10% of the indicated value, whichever is greater.

As used herein, "C—X to C—Y" designates the number of carbon atoms in a chain. For example, C-1 to C-6 alkyl refers to an alkyl chain having a chain of between 1 and 6 carbons (e.g., methyl, ethyl, propyl, butyl, pentyl, hexyl). Unless specifically stated otherwise, the chain can be linear, branched or cyclic. Thus, the general designation of C-1 to C-6 alkyl also include, C-1 to C-6 linear alkyls, C-3 to C-6 branched alkyls and C-3 to C-6 cyclic alkyls.

The section headings used herein are for organizational purposes and are not to be construed or otherwise interpreted as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

DETAILED DESCRIPTION

It is to be understood that both the foregoing general description and the following detailed description are illustrative and explanatory, and are not restrictive of the subject matter, as claimed. The objects, features, advantages and ideas of the disclosed subject matter will be apparent to those skilled in the art from the description provided in the specification, and the disclosed subject matter will be readily practicable by those skilled in the art on the basis of the description appearing herein. The description of any "preferred embodiments" and/or the Examples which show preferred modes for practicing the disclosed subject matter are included for the purpose of disclosed subject matter and explanation and are not intended to limit the scope of the claims.

It will be apparent to those skilled in the art that various modifications may be made in how the disclosed subject matter is practiced based on described aspects in the specification without departing from the spirit and scope of the disclosed subject matter disclosed herein.

One aspect of this invention is an inventive composition comprising components a), b), c) and d), wherein component a) is an acrylic polymer comprising repeat units selected from ones having structure (1), (2), (3), (4), (5), (6), and (7) wherein these repeat units are present in said acrylic polymer in the following mole % ranges, based on the total moles of all different repeat units present, and further where the summation of the individual mole % values for all repeat units present in said polymer must equal 100 mole %, the repeat unit of structure (1) ranges from about 10 mole % to about 35 mole %, the repeat unit of structure (2) ranges from 0 mole % to about 20 mole %, the repeat unit of structure (3) ranges from about 0 mole % to about 55 mole %, the repeat unit of structure (4) ranges from about 0 mole % to about 30 mole %, the repeat unit of structure (5) ranges from about 15 mole % to about 55 mole %, the repeat unit of structure (6) ranges from about 0 mole % to about 40 mole %, the repeat unit of structure (7) ranges from about 0 mole % to about 25 mole %, and $R_1$, $R_2$, $R_3$, $R_4$, $R_5$, $R_6$, and $R_7$ are individually selected from either H, F, a C-1 to C-4 perfluoroalkyl, or a C-1 to C-4 alkyl, $R_8$ and $R_9$ are individually selected from H, a C-1 to C-4 alkyl, a C-1 to C-4 alkyloxy alkyl, and a halogen, $R_{10}$ is a C-3 to C-8 cyclic alkyl, or a C-7 to C-14 alicyclic alkyl, $R_{11}$ is a C-2 to C-8 (hydroxy)alkylene moiety, $R_{12}$ is an acid cleavable group, $R_{13}$ is a C-3 to C-12, (alkyloxy)alkylene moiety, and wherein said acrylic polymer has a dissolution rate, of at least about 100 Å/sec and lower than about 13000 Å/sec in 0.26 N aqueous tetramethylammonium hydroxide (TMAH),

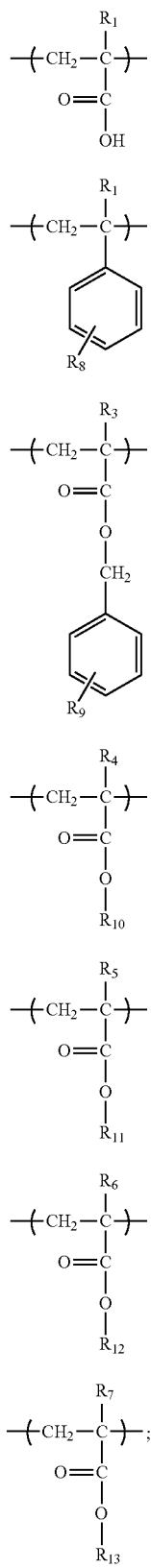

component b) is a Novolak resin having a dissolution rate in 0.26 N aqueous TMAH of at least 50 Å/sec;

component c) is a diazonaphthoquinone (DNQ) photoactive compound (PAC) (a.k.a. DNQ-PAC); and component d) is an organic spin casting solvent, and said acrylic polymer comprises about 0.5 wt % solids to about 70 wt % of solids and said DNQ PAC comprises about 5 wt % solids to about 20 wt % of solids in said composition, and further wherein a coated film of said composition has a dark erosion less than 10 Å/sec in 0.26 N aqueous TMAH.

COMPONENT a), ACRYLIC/POLYMERS

In one embodiment of the above inventive composition, component a), is an acrylic polymer comprising repeat units selected from ones having structure (1), (2), (3), (4), (5), (6), and (7) wherein the repeat unit of structure (1) ranges from about 10 mole % to about 35 mole %, the repeat unit of structure (2) ranges from 0 mole % to about 20 mole %, the repeat unit of structure (3) ranges from about 10 mole % to about 55 mole %, the repeat unit of structure (4) ranges from about 0 mole % to about 30 mole %, the repeat unit of structure (5) ranges from about 15 mole % to about 55 mole %, the repeat unit of structure (6) ranges from about 0 mole % to about 40 mole %, the repeat unit of structure (7) ranges from about 0 mole % to about 25 mole %.

In another embodiment of the above inventive composition component a), is an acrylic polymer comprising repeat units selected from ones having structure (1), (2), (3), (4), (5), (6), and (7) wherein these repeat units are present in said acrylic polymer in the following mole % ranges based on the total moles of all different repeat units present, and further where the summation of the individual mole % values for all repeat units present in said polymer must equal 100 mole %, the repeat unit of structure (1) ranges from about 10 mole % to about 35 mole %, the repeat unit of structure (2) ranges from 10 mole % to about 20 mole %, the repeat unit of structure (3) ranges from about 0 mole % to about 55 mole %, the repeat unit of structure (4) ranges from about 0 mole % to about 30 mole %, the repeat unit of structure (5) ranges from about 15 mole % to about 55 mole %, the repeat unit of structure (6) ranges from about 0 mole % to about 40 mole %, the repeat unit of structure (7) ranges from about 0 mole % to about 25 mole %.

In one embodiment of the inventive composition described herein, the acrylic polymer comprises from about 4 to about 50 wt % solids. In another aspect of this embodiment said the acrylic polymer comprises from about 8 to about 30 wt % solids; in another from about 10 to about 30 wt % solids.

In one embodiment of the inventive compositions described herein, said dissolution rate of said acrylic polymer ranges from about 100 to about 6000 Å/sec. In another aspect of this embodiment said dissolution rate of said acrylic polymer ranges from about 120 to about 3000 Å/sec. In yet another embodiment it is from about 120 to 2000 Å/sec. In a further embodiment it is from about 120 to 1000 Å/sec.

In one embodiment of the inventive compositions described herein, said acrylate polymer is one whose repeat units consist of ones having structures (1), (3), (4) and (5). In another aspect of this embodiment structure (1) ranges from about 20 to about 35 mole %, structure (3) ranges from about 30 to about 50 mole %; structure (4) ranges from about 5 to about 20 mole %; and structure (5) ranges from about 5 to about 20 mole %. In another aspect of this embodiment structure (1) ranges from about 25 to about 35 mole %, structure (3) ranges from about 40 to about 50 mole %; structure (4) ranges from about 7 to about 15 mole %; and structure (5) ranges from about 10 to about 20 mole %. In yet another aspect of this embodiment structure (1) is about 30 mole %, structure (3) is about 45 mole %, structure (4) is about 10 mole % and structure (5) is about 15 mole %. In another aspect of this embodiment it is one wherein $R_9$ is H, and $R_{10}$ is a C-7 to C-14 alicyclic alkyl. In another aspect of this embodiment said acrylate polymer is one consisting more specifically of repeat units having structures (1), (3a), (4a) and (5a), wherein n is the number of methylene spacer moieties and ranges from an integer from 1 to 4, $R_1$, $R_3$, $R_4$, and $R_5$, are individually selected from a C-1 to C-4 alkyl, and $R_{5'}$ is selected from H and a C-1 to C-4 alkyl. In a further, more specific, example of this embodiment said acrylic polymer is one consisting more specifically of repeat units having structures (1a), (3b), (4b) and (5b).

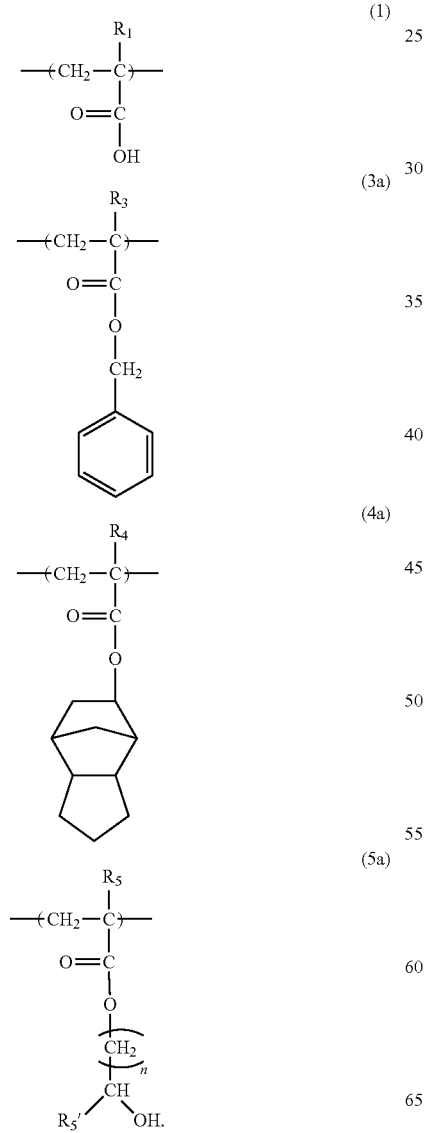

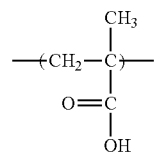

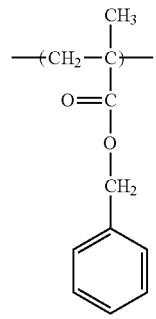

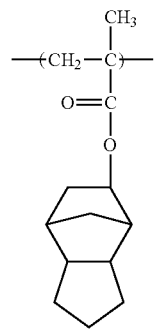

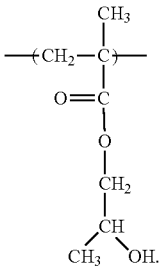

In one embodiment of the inventive compositions described herein, said acrylate polymer is one whose repeat units consist of ones having structures (1), (3), (5) and (7). In one aspect of this embodiment structure (1) ranges from about 16 to about 32 mole %, structure (3) ranges from about 18 to about 35 mole %, structure (5) ranges from about 30 to about 40 mole % and structure (7) ranges from about 10 to about 20 mole %. In another aspect of this embodiment said acrylate is one wherein $R_9$ is H. In another aspect of this embodiment said acrylate polymer is one consisting more specifically of repeat units having structures (1), (3a), (5a) and (7a), wherein n and n' are the numbers of methylene spacer moieties and range, independently, from 1 to 4, $R_1$, $R_3$, $R_5$, and $R_7$, individually, are selected from a C-1 to C-4 alkyl, $R_{5'}$ and $R_{7'}$ are individually selected from H or a C-1 to C-4 alkyl, and $R_{7''}$, is a C-1 to C-4 alkyl. In a further, more specific, example of this embodiment said acrylic polymer is one consisting more specifically of repeat units having structures (1a), (3b), (5b), and (7b).

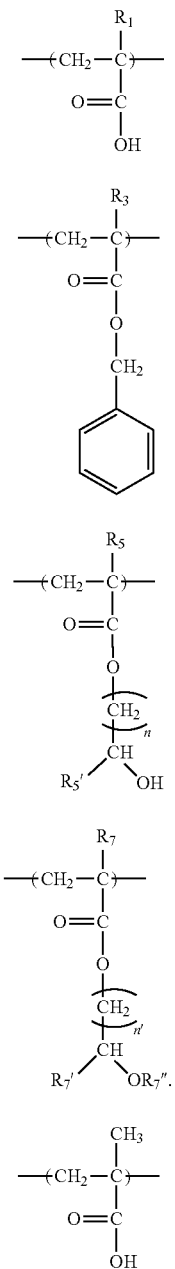
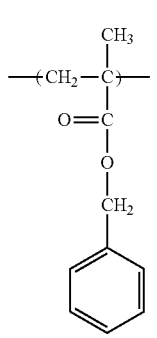
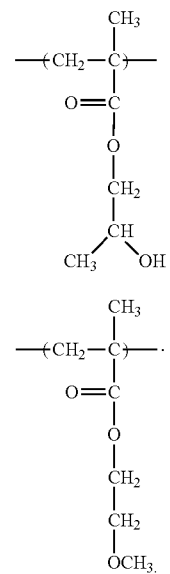
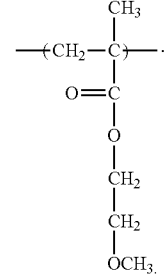

In one embodiment of the inventive compositions described herein, said acrylate polymer is one whose repeat units consist of ones having structures (1), (2), (5) and (6). In one aspect of this embodiment structures (1) ranges from about 18 to about 30 mole %, structure (2) ranges from about 11 to about 15 mole %, structure (5) ranges from about 25 to about 35 mole %, structure (6) ranges from about 25 to about 35 mole %. In another aspect of this embodiment said acrylate polymer is consisting more specifically of repeat units having structures (1), (2a), (5a) and (6), wherein n is an integer number of methylene spacer moieties and ranges from 1 to 4, $R_1$, $R_5$, and $R_6$, are individually selected from a C-1 to C-4 alkyl, $R_{5'}$ is selected from H and a C-1 to C-4 alkyl, $R_8$ are individually selected from H, a C-1 to C-4 alkyl, $R_{12}$ is an acid cleavable protecting group selected from a C-4 to C-12 tertiary alkyl moiety having at least one beta hydrogen, an acetal moiety and a ketal moiety. In a further, more specific, example of this embodiment said acrylic polymer is one consisting more specifically of repeat units having structures (1a), (2b), (5b) and (6), $R_{12}$ is a C-4 to C-12 tertiary alkyl having at least one beta hydrogen present. In a further, more specific, example of this embodiment said acrylic polymer is one consisting more specifically of repeat units having structures (1a), (2b), (5b) and (6a).

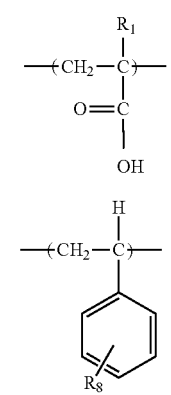
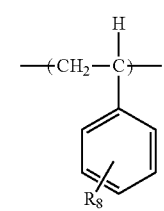

-continued

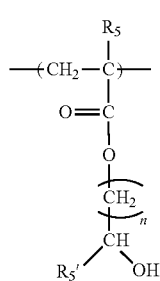
(5a)

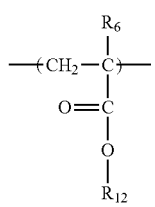
(6)

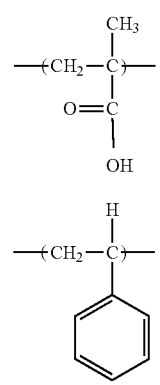
(1a)
(2b)
(5b)

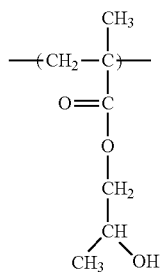
(6a)

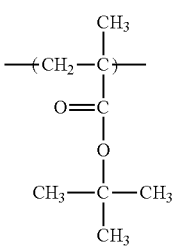

Component b)
Novolak Resin

In one embodiment of the inventive compositions described herein, said Novolak Resin component comprises from about 10 to about 90 wt % solids. In another aspect of this embodiment said Novolak resin ranges from about 40 to about 90 wt % solids.

In one embodiment of the inventive compositions described herein, said Novolak resin component is one which comprises a repeat unit of structure (8), wherein, Ra, and Rb are independently a C-1 to C-4 alkyl, na is 0 to 3, nb is 0 or 1. In one aspect of this embodiment it may comprise two or more different repeat units of structure (8).

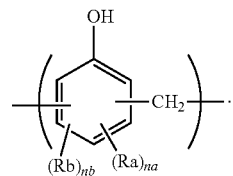
(8)

In another embodiment of the inventive compositions described herein, said Novolak resin component is one which comprises a repeat unit of structure (9), wherein, Rc, is a C-1 to C-4 alkyl, Rd is a C-1 to C-4 alkyl, X is —O—, C(CH$_3$)$_2$—, —(C=O)— or —SO$_2$—, nc is 0 to 3, nd is 0 or 1.

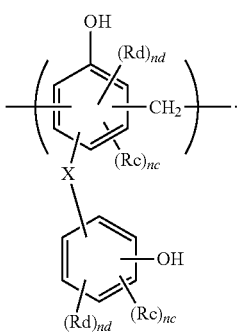
(9)

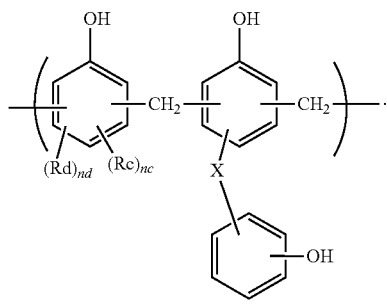
(8)+(9)

In another embodiment of the inventive compositions described herein, said Novolak resin component is one which comprises repeat units of structure (8) and (9). In one aspect of this embodiment it may comprise two or more different repeat units of structure (8). In another aspect of this embodiment it may comprise two or more different repeat units of structure (9).

In one embodiment of the inventive compositions described herein, said Novolak resin component is a m-cresol and formaldehyde Novolak resin.

The following are non-limiting examples of suitable commercially available Novolak resins for use in the disclosed inventive composition as component b) said Novolak resin: The Novolak Alnovol® SPN-560 series of product are m-cresol/formaldehyde Novolaks supplied by Allnex USA Inc). These are available in a range of different dissolution rates from about 700 to about 1,600 Å/s in AZ® 300MIF developer (a.k.a. 0.26 N aqueous TMAH).

The CKS-670© by Novolak series are bisphenol-A/m-cresol-formaldehyde Novolak sold by Aica Kogyo Company, Limited. The dissolution rate of these may be as high as 9000 Å/s in AZ 300MIF developer (a.k.a. 0.26 N aqueous TMAH).

CL23 type Novolak polymers sold by Asahi Yukizai Corporation; for instance, a Novolak that includes 50% m-cresol, 20% p-cresol an 30% 2,5-xylenols, formaldehyde with a $M_w$=4,000 and a dissolution rate of 157.5 Å/s (in AZ 300MIF developer (a.k.a. 0.26 N aqueous TMAH).

Component c)

DNQ PAC

In another embodiment of the inventive compositions described herein, said DNQ PAC ranges from about 5 to about 20 wt % solids.

In another embodiment of the inventive compositions described herein, said DNQ PAC component is a single material or a mixture of materials having general formula (10) wherein Die, $D_{2c}$, $D_{3c}$ and $D_{4c}$ are individually selected from H or a moiety having structure (11), and further wherein at least one of $D_{1c}$, $D_{2c}$, $D_{3c}$ or $D_{4c}$ is a moiety having structure (11).

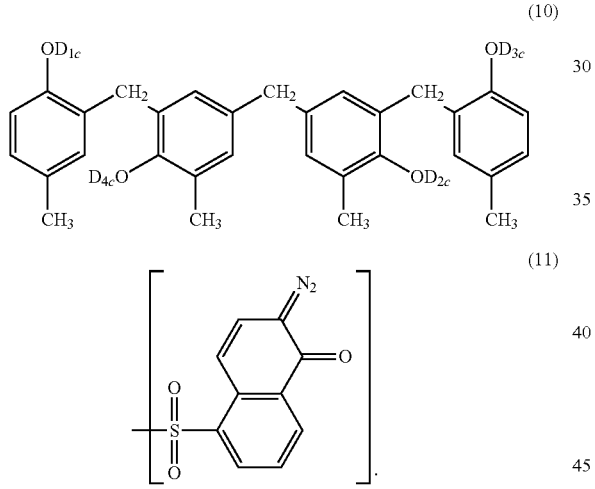

(10)

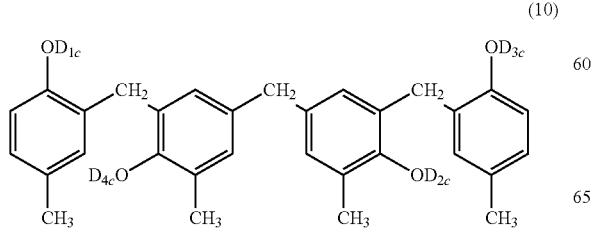

(11)

In another embodiment of the inventive compositions described herein, said DNQ PAC component is a single material or a mixture of materials having general formula (10) wherein Die, $D_{2c}$, $D_{3c}$ and $D_{4c}$ are individually selected from H or a moiety having structure (12), and further wherein at least one of $D_{1c}$, $D_{2c}$, $D_{3c}$ or $D_{4c}$ is a moiety having structure (12).

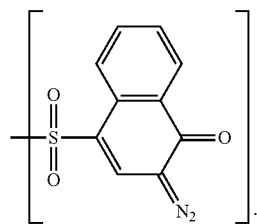

(12)

In another embodiment of the inventive compositions described herein, said DNQ PAC component is a single material or a mixture of materials having general formula (13a), wherein Die, $D_{2e}$, and $D_{3e}$ are individually selected from H or a moiety having structure (11), and further wherein at least one of $D_{1e}$, $D_{2e}$, or $D_{3e}$ is a moiety having structure (11),

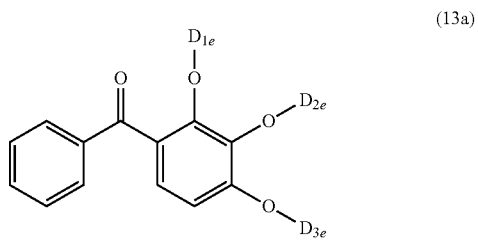

(13a)

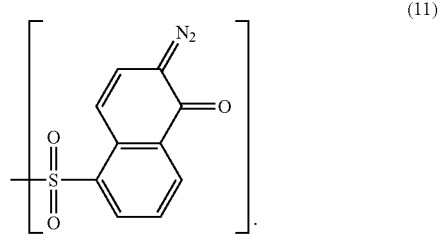

(11)

In another embodiment of the inventive compositions described herein, said DNQ PAC component is a single material or a mixture of materials having general formula (13a), wherein $D_{1e}$, $D_{2e}$, and $D_{3e}$ are individually selected from H or a moiety having structure (12), and further wherein at least one of $D_{1e}$, $D_{2e}$, or $D_{3e}$ is a moiety having structure (12),

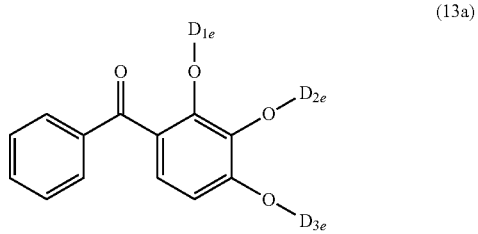

(13a)

-continued

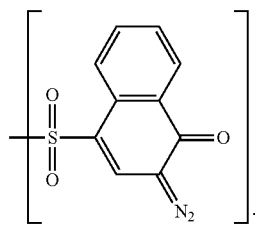

(12)

In another embodiment of the inventive compositions described herein, said DNQ PAC component is a single material or a mixture of materials having general formula (13b), wherein $D_{1e}$, $D_{2e}$, $D_{3e}$ and $D_{4e}$ are individually selected from H or a moiety having structure (11), and further wherein at least one of $D_{1e}$, $D_{2e}$, $D_{3e}$ and $D_{4e}$ is a moiety having structure (11).

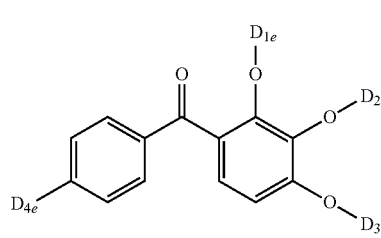

(13b)

(11)

In another embodiment of the inventive compositions described herein, said DNQ PAC component is a single material or a mixture of materials having general formula (13b), (wherein $D_{1e}$, $D_{2e}$, $D_{3e}$ and $D_{4e}$ are individually selected from H or a moiety having structure (12), and further wherein at least one of $D_{1e}$, $D_{2c}$, $D_{3e}$ and $D_{4e}$ is a moiety having structure (12).

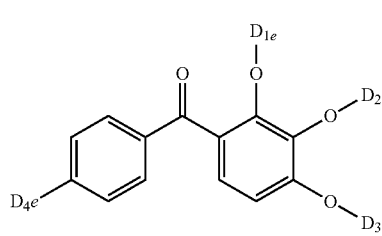

(13b)

-continued

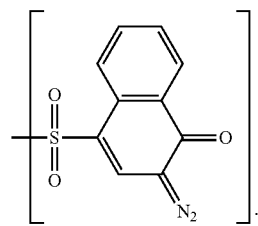

(12)

In another embodiment of the inventive compositions described herein, said DNQ PAC component is a single material or a mixture of materials having general formula (14), wherein $D_{1f}$, $D_{2f}$, $D_{3f}$ and $D_{4f}$ are individually selected from H or a moiety having structure (11), and further wherein at least one of $D_{1f}$, $D_{2f}$, $D_{3f}$ or $D_{4f}$ is a moiety having structure (11),

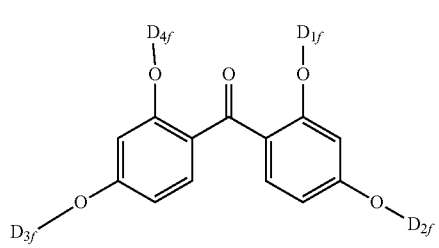

(14)

(11)

In another embodiment of the inventive compositions described herein, said DNQ PAC component is a single material or a mixture of materials having general formula (14), wherein $D_{1f}$, $D_{2f}$, $D_{3f}$ and $D_{4f}$ are individually selected from H or a moiety having structure (12), and further wherein at least one of $D_{1f}$, $D_{2f}$, $D_{3f}$ or $D_{4f}$ is a moiety having structure (12).

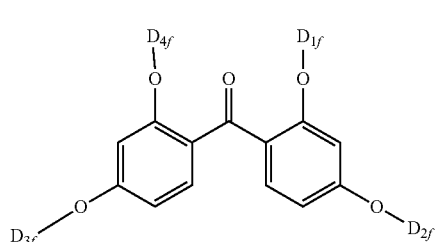

(14)

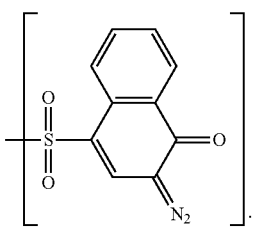

(12)

In another embodiment of the inventive compositions described herein, said DNQ PAC component is a mixture of the above described DNQ PAC materials.

The following are non-limiting examples of suitable DNQ PAC for used in the disclosed inventive composition as component c) said DNQ PAC component:

PW898 (CAS 107761-81-9) is a 2,2'-4,4-tetrahydroxy-DNQ PAC (6-diazo-5,6-dihydro-5-oxo-1-naphthalene-sulfonic acid ester with (4-hydroxyphenyl)-(2,3,4-trihydroxyphenyl), methanone) available from Accel Pharmtech LLC (East Brunswick, N.J.). It is a mixture of materials having general formula (13b), wherein $D_{1e}$, $D_{2e}$, $D_{3e}$ and $D_{4c}$ are individually selected from H or a moiety having structure (11), and further wherein at least one of $D_{1e}$, $D_{2e}$, $D_{3e}$ or $D_{4e}$ is a moiety having structure (11).

NK-280 is a DNQ-PC sold under this name by TOYO GOSEI., LTD.

It is a mixture of materials having general formula (10) wherein $D_{1c}$, $D_{2c}$, $D_{3c}$ and $D_{4c}$ are individually selected from H or a moiety having structure (11), where at least one of $D_{1c}$, $D_{2c}$, $D_{3c}$, or $D_{4c}$ is a moiety having structure (11) and on average about 2.8 of the phenolic positions $D_{1c}$, $D_{2c}$, $D_{3c}$ and $D_{4c}$ groups are esterified with (11).

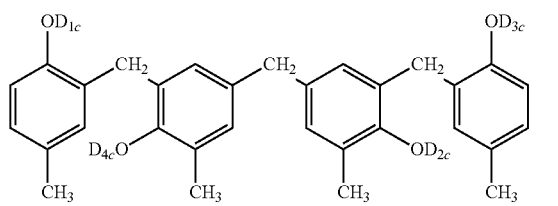

(10)

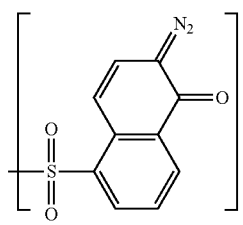

(11)

Component d)
Organic Spin Casting Solvent

The organic spin casting solvent component is an organic solvent suitable for spin casting a uniform film on a substrate. Such solvent at room temperature should be able to simultaneously impart good solubility to resist components, and have a volatility (vapor pressure) that is not too high, causing it to evaporate too quickly forming a non-uniform film, or too low a volatility such that the drying time exceeds several minutes which increases the probability that particles will deposit causing defects. Examples of suitable organic solvents include, without limitation, butyl acetate, amyl acetate, cyclohexyl acetate, 3-methoxybutyl acetate, methyl ethyl ketone, methyl amyl ketone, cyclohexanone, cyclopentanone, ethyl-3-ethoxy propanoate, methyl-3-ethoxy propanoate, methyl-3-methoxy propanoate, methyl acetoacetate, ethyl acetoacetate, diacetone alcohol, methyl pivalate, ethyl pivalate, propylene glycol monomethyl ether, propylene glycol monoethyl ether, propylene glycol monomethyl ether propanoate, propylene glycol monoethyl ether propanoate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, gamma-butyrolactone, propylene glycol methyl ether acetate, propylene glycol ethyl ether acetate, propylene glycol propyl ether acetate, methyl lactate, ethyl lactate, propyl lactate, tetramethylene sulfone, propylene glycol dimethyl ether, dipropylene glycol dimethyl ether, ethylene glycol dimethyl ether or diethylene glycol dimethyl ether, gamma butyrolactone. These solvents may be used singly or in mixtures of two or more. In one embodiment, the solvent component is PGMEA (1-methoxy-2-propanyl acetate).

Optional Components

In another embodiment of the any of the above described positive working photosensitive compositions other optional components, which have compatibility with and can be added to the inventive photoresist composition disclosed and claimed herein according to need, include heterocyclic thiol compounds, surface leveling agents, stabilizers auxiliary resins, plasticizers, and the like to improve the properties of the resist layer.

Heterocyclic Thiol

In one embodiment of the above described inventive compositions it further comprises at least one optional heterocyclic thiol component. In one aspect of this embodiment said heterocyclic thiol component is at least one heterocyclic thiol compound comprising a ring structure chosen from the general structures (15), (16) or (17), or tautomers thereof; and

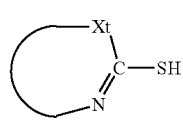

(15)

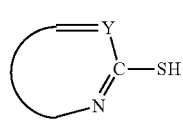

(16)

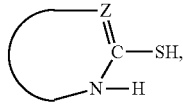

(17)

wherein,
said ring structure is a single ring structure having from 4 to 8 atoms, or a multi ring structure having from 5 to 20 atoms; and wherein the single ring structure, or the multi ring structure comprises an aromatic, non-aromatic, or heteroaromatic ring, and
in said structure (15), Xt is selected from the group consisting of $C(Rt_1)(Rt_2)$, O, S, Se, and Te;
in said structure (16), Y is selected from the group consisting of $C(Rt_3)$ and N;

in said structure (17), Z is selected from the group consisting of C(Rt$_3$) and N; and
Rt$_1$, Rt$_2$, and Rt$_3$ are independently selected from the group consisting of H, a substituted alkyl group having 1 to 8 carbon atoms, an unsubstituted alkyl group having 1 to 8 carbon atoms, a substituted alkenyl group having 2 to 8 carbon atoms, unsubstituted alkenyl group having 2 to 8 carbon atoms, a substituted alkynyl group having 2 to 8 carbon atoms, unsubstituted alkynyl group having 2 to 8 carbon atoms, a substituted aromatic group having 6 to 20 carbon atoms, a substituted heteroaromatic group having 3 to 20 carbon atoms, unsubstituted aromatic group having 6 to 20 carbon atoms and unsubstituted heteroaromatic group having 3 to 20 carbon atoms.

In another embodiment wherein said inventive composition comprises at least one heterocyclic thiol chosen from the above general structures (15), (16) or (17), or tautomers thereof these may be chosen without limitation from substituted or unsubstituted triazole thiols, substituted or unsubstituted imidazole thiols, substituted or unsubstituted triazine thiols, substituted or unsubstituted mercapto pyrimidines, substituted or unsubstituted thiadiazole-thiols, substituted or unsubstituted indazole thiols, tautomers thereof or combinations thereof. Substituents may include, without limitation, saturated or unsaturated hydrocarbon groups, substituted or unsubstituted aromatic rings, aliphatic, aromatic or heteroaromatic alcohols, amines, amides, imides carboxylic acids, esters, ethers, halides, and the like. Such substituents may be used in concert with the heterocyclic thiol to improve solubility, to modify interaction with the substrate, to enhance exposure to light or to act as an antihalation dye.

In another embodiment wherein said inventive composition comprises at least one heterocyclic thiol chosen from the above general structures (15), (16) or (17), or tautomers thereof such heterocyclic thiols may be chosen, without limitation from the following compounds (18) to (34) in unsubstituted or substituted form:

(18)

1H-1,2,4-triazole-3-thiol (19)

1H-1,2,4-triazole-5-thiol (20)

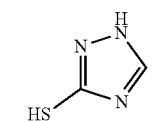

1H-imidazole-2-thiol (21)

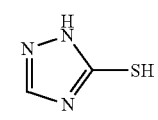

1H-imidazole-2-thiol (22)

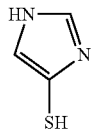

1H-imidazole-4-thiol (23)

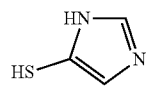

1H-imidazole-5-thiol (24)

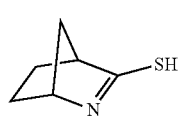

2-azabicyclo[2.2.1]hept-2-ene-3-thiol (25)

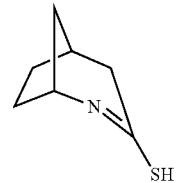

2-azabicyclo[3.2.1]oct-2-ene-3-thiol (26)

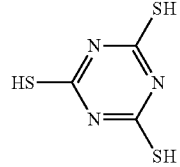

1,3,5-triazine-2,4,6-trithiol (27)

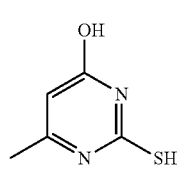

2-mercapto-6-methylpyrimidin-4-ol (28)

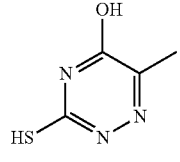

3-mercapto-6-methyl-1,2,4-triazin-5-ol (29)

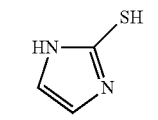

2-mercaptopyrimidine-4,6-diol

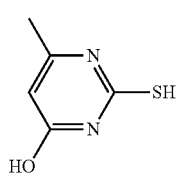

2-mercapto-6-methylpyrimidin-4-ol (30)

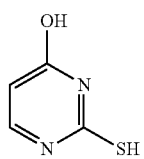

2-mercaptopyrimidin-4-ol (31)

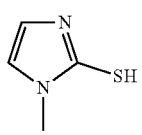

1-methyl-1H-imidazole-2-thiol (32)

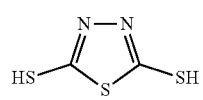

1,3,4-thiadiazole-2,5-dithiol (33)

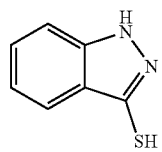

1H-indazole-3-thiol (34)

In another embodiment wherein said inventive composition comprises at least one heterocyclic thiol chosen from the above general structures (15), (16) or (17), or tautomers thereof such heterocyclic thiols may be chosen from thiouracil derivatives such as 2-thiouracil are further examples. These include, without limitation, 5-methyl-2-thiouracil, 5,6-dimethyl-2-thiouracil, 6-ethyl-5-methyl-2-thiouracil, 6-methyl-5-n-propyl-2-thiouracil, 5-ethyl-2-thioracil, 5-n-propyl-2-thiouracil, 5-n-butyl-2-thiouracil, 5-n-hexyl-2-thiouracil, 5-n-butyl-6-ethyl-2-thiouracil, 5-hydroxy-2-thiouracil, 5,6-dihydroxy-2-thiouracil, 5-hydroxy-6-n-propyl-2-thiouracil, 5-methoxy-2-thiouracil, 5-n-butoxy-2-thiouracil, 5-methoxy-6-n-propyl-2-thiouracil, 5-bromo-2-thiouracil, 5-chloro-2-thiouracil, 5-fluoro-2-thiouracil, 5-amino-2-thiouracil, 5-amino-6-methyl-2-thiouracil, 5-amino-6-phenyl-2-thiouracil, 5,6-diamino-2-thiouracil, 5-allyl-2-thiouracil, 5-allyl-3-ethyl-2-thiouracil, 5-allyl-6-phenyl-2-thiouracil, 5-benzyl-2-thiouracil, 5-benzyl-6-methyl-2-thiouracil, 5-acetamido-2-thiouracil, 6-methyl-5-nitro-2-thiouracil, 6-amino-2-thiouracil, 6-amino-5-methyl-2-thiouracil, 6-amino-5-n-propyl-2-thiouracil, 6-bromo-2-thiouracil, 6-chloro-2-thiouracil, 6-fluoro-2-thiouracil, 6-bromo-5-methyl-2-thiouracil, 6-hydroxy-2-thiouracil, 6-acetamido-2-thiouracil, 6-n-octyl-2-thiouracil, 6-dodecyl-2-thiouracil, 6-tetradodecyl-2-thiouracil, 6-hexadecyl-2-thiouracil, 6-(2-hydroxyethyl)-2-thiouracil, 6-(3-isopropyloctyl)-5-methyl-2-thiouracil, 6-(m-nitrophenyl)-2-thiouracil, 6-(m-nitrophenyl)-5-n-propyl-2-thiouracil, 6-a-naphthyl-2-thiouracil, 6-a-naphthyl-5-t-butyl-2-thiouracil, 6-(p-chlorophenyl)-2-thiouracil, 6-(p-chlorophenyl)-2-ethyl-2-thiouracil, 5-ethyl-6-eicosyl-2-thiouracil, 6-acetamido-5-ethyl-2-thiouracil, 6-eicosyl-5-allyl-2-thiouracil, 5-amino-6-phenyl-2-thiouracil, 5-amino-6-(p-chlorophenyl)-2-thiouracil, 5-methoxy-6-phenyl-2-thiouracil, 5-ethyl-6-(3,3-dimethyloctyl)-2-thiouracil, 6-(2-bromoethyl)-2-thiouracil.

In another embodiment wherein said inventive composition comprises at least one heterocyclic thiol chosen from the above general structures (15), (16) or (17), or tautomers thereof such heterocyclic thiols may be selected from the group consisting of unsubstituted triazole thiol, substituted triazole thiol, unsubstituted imidazole thiol, substituted imidazole thiol, substituted triazine thiol, unsubstituted triazine thiol, a substituted mercapto pyrimidine, unsubstituted mercapto pyrimidine, a substituted thiadiazole-thiol, unsubstituted thiadiazole-thiol, substituted indazole thiol, unsubstituted indazole thiol, tautomers thereof, and combinations thereof.

In another embodiment wherein said inventive composition comprises at least one heterocyclic thiol chosen from the above general structures (15), (16) or (17), or tautomers thereof such heterocyclic thiols may be selected from the group consisting of 1,3,5-triazine-2,4,6-trithiol, 2-mercapto-6-methylpyrimidin-4-ol, 3-mercapto-6-methyl-1,2,4-triazin-5-ol, 2-mercaptopyrimidine-4,6-diol, 1H-1,2,4-triazole-3-thiol, 1H-1,2,4-triazole-5-thiol, 1H-imidazole-2-thiol, 1H-imidazole-5-thiol, 1H-imidazole-4-thiol, 2-azabicyclo[3.2.1]oct-2-ene-3-thiol, 2-azabicyclo[2.2.1]hept-2-ene-3-thiol, 1H-benzo[d]imidazole-2-thiol, 2-mercapto-6-methylpyrimidin-4-ol, 2-mercaptopyrimidin-4-ol, 1-methyl-1H-imidazole-2-thiol, 1,3,4-thiadiazole-2,5-dithiol, 1H-indazole-3-thiol, tautomers thereof and combinations thereof.

Surface Levelling Agent

In one embodiment of the above described inventive compositions it further comprises at least one optional surface leveling agents may include surfactants. In this embodiment, there is no particular restriction with regard to the surfactant, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Chemical Co. Ltd.).

Another aspect of this invention is the use of any of the above described inventive composition as an aqueous developable UV photoresist, preferably in the process described below. Yet another aspect of this invention is a process comprising steps i) to iv), i) coating of any one of the above described inventive compositions on a substrate to form a coating,
ii) baking said coating to form a baked coating,
iii) exposing said baked coating with radiation, preferably UV radiation, through a mask forming an exposed patterned coating,
iv) developing said exposed patterned coating with an aqueous base developer removing areas of said pattern exposed to said radiation forming a photoresist positive image.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

Materials
Chemicals

MTA: additive, (1H-1,2,4-triazole-3-thiol); TEA: (Triethylamine); PGME (1-Methoxy-2-propanol); PGMEA (1-Methoxy-2-propanyl acetate), and any other chemical, unless otherwise indicated were purchased from Sigma Aldrich subsidiary of Merck KGaA (Darmstadt, Germany). NIT PAG, N-hydroxynaphthalimide triflate is sold under the name (NIT PAG, 100%, Tech, pdr), sold by Heraeus PM NA Daychem LLC. APS-437 is a surfactant: from Shinetsu, (Tokyo, Japan).

Novolak Polymers

For the following formulation examples, three Novolak polymers were used:

Novolak-1 is a m-cresol and formaldehyde Novolak and was obtained from Allnex (Alpharetta, Ga.) under the name "ALNOVOL™ SPN 560/47MPAC SLOW," Mw 24010, D: 7.3 and had a bulk dissolution rate in 0.26 N aqueous TMAH developer of 700 Å/sec. Novolak-2 is a m-cresol and formaldehyde Novolak and was obtained from Allnex (Alpharetta, Ga.) under the name "ALNOVOL™ SPN 560/47MPAC FAST," Mw 7,245, D: 4.8 and had a bulk dissolution rate in 0.26 N aqueous TMAH developer of 1,600 Å/sec. Novolak-3 is a 1/1 wt/wt blend of Novolak-1 and Novolak-2, with a bulk dissolution rate in 0.26 N aqueous TMAH developer of 1,000 Å/sec. Novolak CL23 is a Novolak polymer (sold under the name CL23F10G by Asahi Yukizai Corporation) that includes 50% m-cresol, 20% p-cresol an 30% 2,5-xylenols, formaldehyde with a $M_w$=4,000 and a dissolution rate of 157.5 Å/sec in 0.26 N aqueous TMAH.

PW898 (CAS 107761-81-9) is a 2,2'-4,4-tetrahydroxy-DNQ PAC (6-diazo-5,6-dihydro-5-oxo-1-naphthalene-sulfonic acid ester with (4-hydroxyphenyl)-(2,3,4-trihydroxyphenyl), methanone) available from Accel Pharmtech LLC (East Brunswick, N.J.). It is a mixture of materials having general formula (13b), wherein $D_{1e}$, $D_{2e}$, $D_{3e}$ and $D_{4e}$ are individually selected from H or a moiety having structure (11), and further wherein at least one of $D_{1e}$, $D_{2e}$, $D_{3e}$, or $D_{4e}$ is a moiety having structure (11).

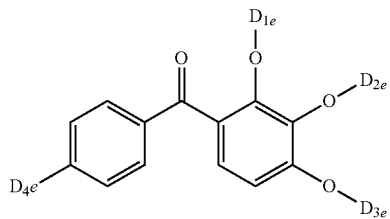

(13b)

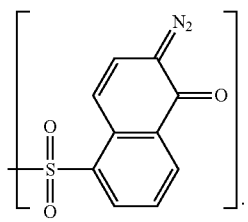

(11)

NK-280 is a DNQ-PC sold under this name by TOYO GOSEI., LTD.

It is a mixture of materials having general formula (10) wherein $D_{1c}$, $D_{2c}$, $D_{3c}$ and $D_{4c}$ are individually selected from H or a moiety having structure (11), where at least one of $D_{1c}$, $D_{2c}$, $D_{3c}$, or $D_{4c}$ is a moiety having structure (11) and on average about 2.8 of the phenolic positions $D_{1c}$, $D_{2c}$, $D_{3c}$ and $D_{4c}$ groups are esterified with (11).

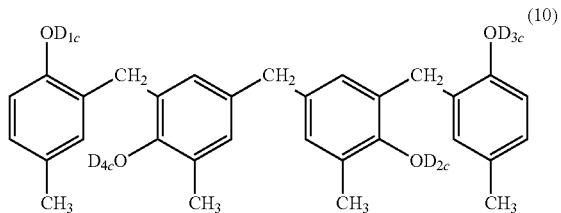

(10)

(11)

Dissolution Experiments

Dissolution experiments to measure dissolution rates of films of acrylate polymers coatings or unexposed resist formulation coatings (a.k.a. dark erosion) were done with AZ 300 MIF Developer (a.k.a. 0.26 N aqueous TMAH), at 23° C. The dissolution rate was obtained by measuring the film thickness before and after development. The dissolution rate was obtained by dividing the film thickness difference divided by the develop time.

Acrylates Synthesis

Synthesis Example 1: (Structure P1)

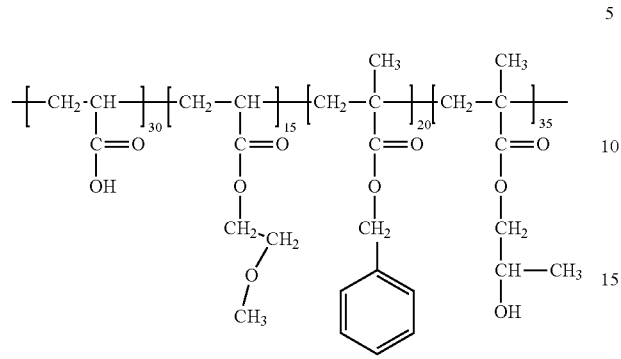

Structure P1

10.81 g of acrylic acid, 9.76 g of methoxyethyl acylate, 17.62 g of benzyl methacrylate, 25.23 g of hydroxypropyl methacrylate were mixed in 95.2 g of propyleneglycol monomethylether (PGME) solvent. The polymerization reaction proceeded in the presence of 1.35 g of AIBN at 90° C., under nitrogen for 18 hours. After cooling down to room temperature, the reaction mixture was precipitated in DI water. The white polymer solid was washed and dried under vacuum at 50° C. yielding 63.0 g (99.3% yield) with a weight average molecular weight of 25003. Thus, acrylic resin P1 was obtained which had a dissolution rate of 12000 Å/sec in 0.26 N aqueous TMAH. Molecular weight can be determined by gel permeation chromatography using a universal calibration method, calibrated to polystyrene standards.

Synthesis Example 2: (Structure P2)

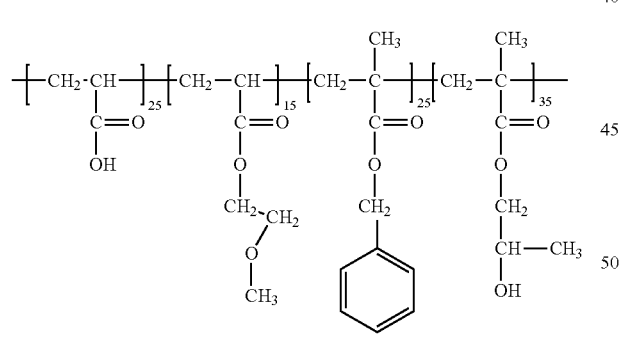

Structure P2

9.00 g of acrylic acid, 9.76 g of methoxyethyl acylate, 22.03 g of benzyl methacrylate, 25.23 g of hydroxypropyl methacrylate were mixed in 101 g of propyleneglycol monomethylether (PGME) solvent. The polymerization reaction proceeded in the presence of 1.35 g of AIBN at 90° C., under nitrogen for 18 hours. After cooling down to room temperature, the reaction mixture was precipitated in DI water. The white polymer solid was washed and dried under vacuum at 50° C. yielding 66.0 g (99.3% yield) with a weight average molecular weight of 30035. Thus, acrylic resin P2 was obtained which had dissolution rate of 8600 Å/sec in 0.26 N aqueous TMAH.

Synthesis Example 3 (Structure P3)

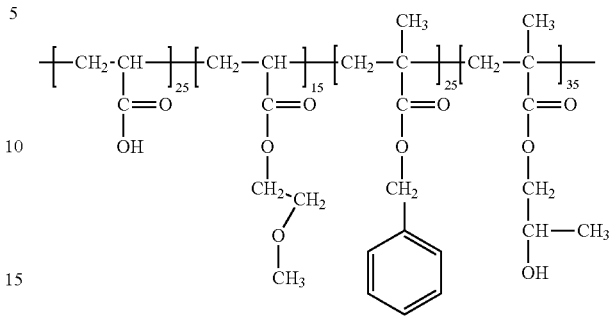

Structure P3

28.82 g of acrylic acid, 39.04 g of methoxyethyl acylate, 105.73 g of benzyl methacrylate, 100.92 g of hydroxypropyl methacrylate were mixed in 419.9 g of propyleneglycol monomethylether (PGME) solvent. The polymerization reaction proceeded in the presence of 5.42 g of AIBN at 80° C., under nitrogen for 18 hours. After cooling down to room temperature, the reaction mixture was precipitated in DI water. The white polymer solid was washed and dried under vacuum at 50° C. yielding 277.0 (99.0% yield) with a weight average molecular weight of 21305. Thus, acrylic resin P3 was obtained which had a dissolution rate of Dissolution rate: 6600 Å/sec.

Synthesis Example 4 (Structure P4)

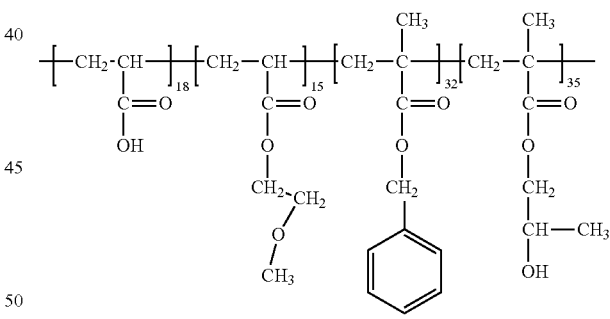

Structure P4

25.94 g of acrylic acid, 39.04 g of methoxyethyl acylate, 112.77 g of benzyl methacrylate, 100.92 g of hydroxypropyl methacrylate were mixed in 426.1 g of propylene glycol monomethyl ether (PGME) solvent. The polymerization reaction proceeded in the presence of 5.42 g of AIBN at 80° C., under nitrogen for 18 hours. After cooling down to room temperature, the reaction mixture was precipitated in DI water. The white polymer solid was washed and dried under vacuum at 50° C. yielding 281.5 (99.1% yield) with a weight average molecular weight of 19415. Thus, acrylic resin P4 was obtained which had a Dissolution rate of 5500 Å/sec in 0.26 N aqueous TMAH. Synthesis Example 5 (Structure P5)

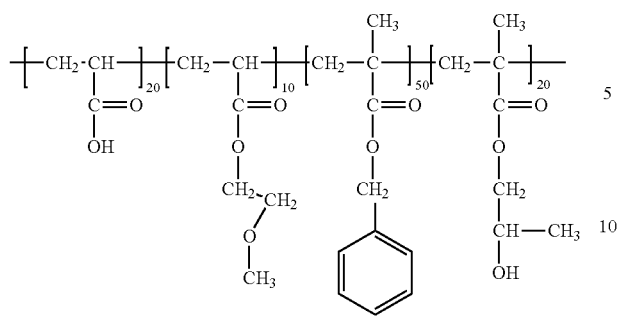

Structure P5

7.21 g of acrylic acid, 6.51 g of methoxyethyl acylate, 44.05 g of benzyl methacrylate, 14.42 g of hydroxypropyl methacrylate were mixed in 295.3 g of propyleneglycol monomethylether (PGME) solvent. The polymerization reaction proceeded in the presence of 1.64 g of AIBN at 80° C., under nitrogen for 18 hours. After cooling down to room temperature, the reaction mixture was precipitated in DI water. The white polymer solid was washed and dried under vacuum at 50° C. yielding 66.68 g (90.3% yield) with a weight average molecular weight of 19109. Thus, acrylic resin P5 was obtained which had a dissolution rate of 35 Å/sec in 0.26 N aqueous TMAH.

Synthesis Example 6 (Structure P5)

Synthesis Example 7 (Structure P7)

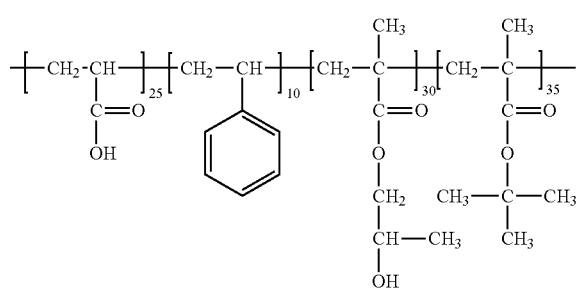

Structure P7

9.01 g of acrylic acid, 5.28 g of Styrene, 21.62 g of hydroxypropyl methacrylate, 24.89 g of tert-butyl methacrylate were mixed in 115.8 g of PGME solvent. The polymerization reaction proceeded in the presence of 1.64 g of AIBN at 80° C., under nitrogen for 18 hours. After cooling down to room temperature, the reaction mixture was precipitated in DI water. The white polymer solid was washed and dried under vacuum at 50° C. yielding 59.67 g (98% yield) with a weight average molecular weight of 21457. Thus, acrylic resin P7 was obtained which had a dissolution rate of 840 Å/sec in 0.26 N aqueous TMAH.

Synthesis Example 8 (Structure P8)

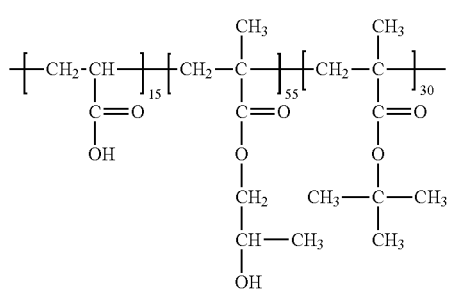

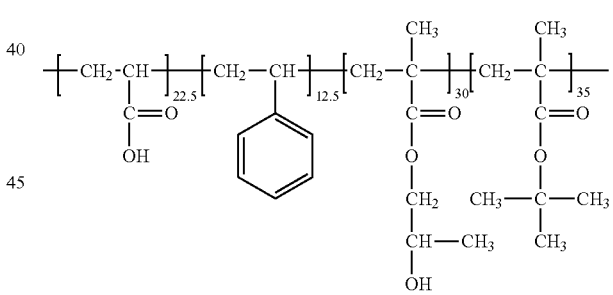

Structure P6

5.40 g of acrylic acid, 39.65 g of hydroxypropyl methacrylate, 21.33 g of tert-butyl methacrylate were mixed in 126.3 g of PGME solvent. The polymerization reaction proceeded in the presence of 1.64 g of AIBN at 90° C., under nitrogen for 18 hours. After cooling down to room temperature, the reaction mixture was precipitated in DI water. The white polymer solid was washed and dried under vacuum at 50° C. yielding 64.58 g (97% yield) with a weight average molecular weight of 18734. Thus, acrylic resin P6 was obtained which had a dissolution rate of 1090 Å/sec in 0.26 N aqueous TMAH.

Structure P8

8.11 g of acrylic acid, 6.51 g of styrene, 21.62 g of hydroxypropyl methacrylate, 24.89 g of tert-butyl methacrylate were mixed in 76.2 g of PGME solvent. The polymerization reaction proceeded in the presence of 1.23 g of AIBN at 90° C., under nitrogen for 18 hours. After cooling down to room temperature, the reaction mixture was precipitated in DI water. The white polymer solid was washed and dried under vacuum at 50° C. yielding 60.50 g (99% yield) with a weight average molecular weight of 18672. Thus, acrylic resin P8 was obtained which had a dissolution rate of 580 Å/sec in 0.26 N aqueous TMAH.

Synthesis Example 9 (Structure P9)

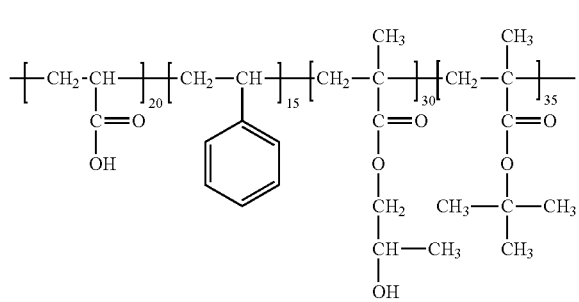

Structure P9

7.20 g of acrylic acid, 7.81 g of styrene, 21.62 g of hydroxypropyl methacrylate, 24.89 g of tert-butyl methacrylate were mixed in 117.3 g of PGME solvent. The polymerization reaction proceeded in the presence of 1.64 g of AIBN at 90° C., under nitrogen for 18 hours. After cooling down to room temperature, the reaction mixture was precipitated in DI water. The white polymer solid was washed and dried under vacuum at 50° C. yielding 60.80 g (99% yield) with a weight average molecular weight of 15542. Thus, acrylic resin P9 was obtained which had a dissolution rate of 400 Å/sec in 0.26 N aqueous TMAH.

Synthesis Example 10 (Structure P10)

Structure P10

5.40 g of acrylic acid, 10.42 g of styrene, 21.62 g of hydroxypropyl methacrylate, 24.89 g of tert-butyl methacrylate were mixed in 118.7 g of PGME solvent. The polymerization reaction proceeded in the presence of 1.64 g of AIBN at 90° C., under nitrogen for 18 hours. After cooling down to room temperature, the reaction mixture was precipitated in DI water. The white polymer solid was washed and dried under vacuum at 50° C. yielding 63.0 g (99% yield) with a weight average molecular weight of 14503. Thus, acrylic resin P10 was obtained which had a dissolution rate of dissolution rate: 0 Å/sec in 0.26 N aqueous TMAH.

Acrylic Polymer P11 (Structure P11) (CPR215)

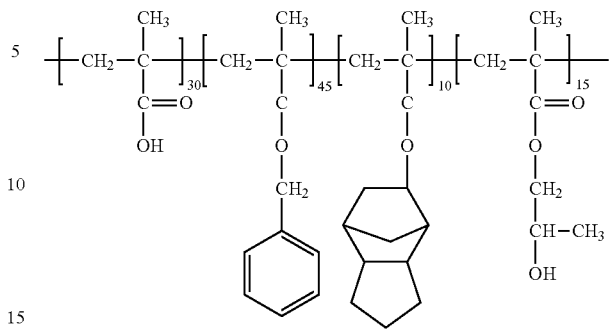

Structure P11

Poly[methacrylic acid-co-benzyl methacrylate-co-tricyclo(5.2.1.0/2.6) decyl methacrylate-co-2-hydroxypropyl methacrylate was obtained from Miwon Commercial Co., Ltd. (Miwon Bldg, 464 Anyang-ro, Manan-gu, Anyang-si, Gyeonggi-do, 430-806, Korea) this polymer had a dissolution rate: 135 Å/sec in 0.26 N aqueous TMAH.

Coating and Formulations

All formulations were tested on 8" diameter Si and Cu wafers. The Si wafers were rehydration baked and vapor primed with hexamethyldisilazane (HMDS). Exposures were done with The resist coatings were prepared by spin coating the resist samples and applying a soft bake for 300 seconds at 130° C. on standard wafer track hot plate in contact mode. The spin speed was adjusted to obtain 60-micron thick resist films. All film thickness measurements were conducted on Si wafers using optical measurements.

FORMULATION EXAMPLES

Formulation Example 1

7.8 g polymer of Synthesis Example 1, 27.2 g of Novolak-3, 4.0 g of DNQ PAC PW898, 0.025 g of 1H-1,2,4-triazole-3-thiol [also called 3-mercapto-1,2,4-triazole] and 0.023 g of APS-437 were dissolved in 61 g of PGMEA solvent to make a solution. The solution was filtered for tests.

Formulation Example 1a 3.9 g polymer of Synthesis Example 1, 30.6 g of Novolak-3, 4.5 g of DNQ PAC PW898, 0.025 g of 1H-1,2,4-triazole-3-thiol [also called 3-mercapto-1,2,4-triazole] and 0.023 g of APS-437 were dissolved in 61 g of PGMEA solvent to make a solution. The solution was filtered for tests.

Formulation Example 2

11.7 g polymer of Synthesis Example 1, 23.8 g of Novolak-3, 3.5 g of diazonaphtoquinonesulfonic ester [also called PW898], 0.025 g of 1H-1,2,4-triazole-3-thiol [also called 3-mercapto-1,2,4-triazole] and 0.023 g of APS-437 were dissolved in 61 g of PGMEA solvent to make a solution. The solution was filtered for tests.

Formulation Example 3

19.5 g polymer of Synthesis Example 1, 17.0 g of Novolak-3, 2.5 g of diazonaphtoquinonesulfonic ester [also called PW898], 0.025 g of 1H-1,2,4-triazole-3-thiol [also called 3-mercapto-1,2,4-triazole] and 0.023 g of APS-437 were dissolved in 61 g of PGMEA solvent to make a solution. The solution was filtered for tests.

Formulation Example 4

27.3 g polymer of Synthesis Example 1, 10.2 g of Novolak-3, 1.5 g of DNQ PAC PW898, 0.025 g of 1H-1,2,4-triazole-3-thiol [also called 3-mercapto-1,2,4-triazole] and 0.023 g of APS-437 were dissolved in 61 g of PGMEA solvent to make a solution. The solution was filtered for tests.

Formulation Example 5

7.8 g polymer of Synthesis Example 2, 27.2 g of Novolak-3, 4.0 g of DNQ PAC PW898, 0.025 g of 1H-1,2,4-triazole-3-thiol [also called 3-mercapto-1,2,4-triazole] and 0.023 g of PS-437 were dissolved in 61 g of PGMEA solvent to make a solution. The solution was filtered for tests.

Formulation Example 5a 3.9 g polymer of Synthesis Example 2, 30.6 g of Novolak-3, 4.5 g of of DNQ PAC PW898, 0.025 g of 1H-1,2,4-triazole-3-thiol [also called 3-mercapto-1,2,4-triazole] and 0.023 g of APS-437 were dissolved in 61 g of PGMEA solvent to make a solution. The solution was filtered for tests.

Formulation Example 6

11.7 g polymer of Synthesis Example 2, 23.8 g of Novolak-3, 3.5 g of of DNQ PAC PW898, 0.025 g of 1H-1,2,4-triazole-3-thiol [also called 3-mercapto-1,2,4-triazole] and 0.023 g of APS-437 were dissolved in 61 g of PGMEA solvent to make a solution. The solution was filtered for tests.

Formulation Example 7

5.56 g polymer of Synthesis Example 2, 23.0 g of Novolak resin CL23F resin, 4.81 g DNQ PAC NK280, 0.025 g of 1H-1,2,4-triazole-3-thiol [also called 3-mercapto-1,2,4-triazole] and 0.023 g of APS-437 were dissolved in 66.58 g of PGMEA solvent to make a solution. The solution was filtered for tests.

Formulation Example 8

10.3 g polymer of Synthesis Example 2, 19.8 g of Novolak resin (CL23F resin), 4.15 g of diazonaphtoquinonesulfonic ester [also called NK280], 0.025 g of 1H-1,2,4-triazole-3-thiol [also called 3-mercapto-1,2,4-triazole] and 0.023 g of APS-437 were dissolved in 65.7 g of PGMEA solvent to make a solution. The solution was filtered for tests.

Formulation Example 9

7.8 g polymer of Synthesis Example 8, 27.2 g of Novolak-3, 4.0 g of diazonaphtoquinonesulfonic ester [also called PW898], 0.025 g of 1H-1,2,4-triazole-3-thiol [also called 3-mercapto-1,2,4-triazole] and 0.023 g of APS-437 were dissolved in 61 g of PGMEA solvent to make a solution. The solution was filtered for tests.

Formulation Example 10

11.7 g polymer of Synthesis Example 8, 23.8 g of Novolak-3, 3.5 g of diazonaphtoquinonesulfonic ester [also called PW898], 0.025 g of 1H-1,2,4-triazole-3-thiol [also called 3-mercapto-1,2,4-triazole] and 0.023 g of APS-437 were dissolved in 61 g of PGMEA solvent to make a solution. The solution was filtered for tests.

Formulation Example 11

15.6 g polymer of Synthesis Example 8, 20.4 g of Novolak-3, 3.0 g of diazonaphtoquinonesulfonic ester [also called PW898], 0.025 g of 1H-1,2,4-triazole-3-thiol [also called 3-mercapto-1,2,4-triazole] and 0.023 g of APS-437 were dissolved in 61 g of PGMEA solvent to make a solution. The solution was filtered for tests.

Formulation Example 12

19.5 g polymer of Synthesis Example 8, 17.0 g of Novolak-3, 2.5 g of diazonaphtoquinonesulfonic ester [also called PW898], 0.025 g of 1H-1,2,4-triazole-3-thiol [also called 3-mercapto-1,2,4-triazole] and 0.023 g of APS-437 were dissolved in 61 g of PGMEA solvent to make a solution. The solution was filtered for tests.

Formulation Example 13

27.3 g polymer of Synthesis Example 8, 10.2 g of Novolak-3, 1.5 g of diazonaphtoquinonesulfonic ester [also called PW898], 0.025 g of 1H-1,2,4-triazole-3-thiol [also called 3-mercapto-1,2,4-triazole] and 0.023 g of APS-437 were dissolved in 61 g of PGMEA solvent to make a solution. The solution was filtered for tests.

Formulation Example 14 (Comparison Example with No Acrylate Polymer)

34.3 g of Novolak-3, 4.7 g of diazonaphtoquinonesulfonic ester [also called PW898], 0.025 g of 1H-1,2,4-triazole-3-thiol [also called 3-mercapto-1,2,4-triazole] and 0.023 g of APS-437 were dissolved in 61 g of PGMEA solvent to make a solution. The solution was filtered for tests.

Formulation Example 15 (Comparison Example with No Acrylate Polymer)

27.6 g of Novolak resin CL23F resin, 5.77 g of diazonaphtoquinonesulfonic ester [also called NK280], 0.025 g of 1H-1,2,4-triazole-3-thiol [also called 3-mercapto-1,2,4-triazole] and 0.023 g of APS-437 were dissolved in 66.58 g of PGMEA solvent to make a solution. The solution was filtered for tests.

Coating of Formulations:

All formulations were tested on 6 or 8" diameter Si and Cu wafers. The Si wafers were rehydration baked and vapor primed with hexamethyldisilazane (HMDS). The Cu wafers were silicon wafers coated with 5,000 Angstroms of silicon dioxide, 250 Angstroms of tantalum nitride, and 3,500 Angstroms of Cu (PVD deposited).

The resist coatings were prepared by spin coating the resist samples and applying a soft bake for 120 seconds at 110° C. on standard wafer track hot plate in contact mode.

The spin speed was adjusted to obtain 5 to 10-microns thick resist films. All film thickness measurements were conducted on Si wafers using optical measurements.

Imaging:

The wafers were exposed on SUSS MA200 CC Mask Aligner or on ASML 250 i-line stepper. The resist was waited for 10-60 mins without post exposure baking and then puddle developed for 120 to 360 seconds in AZ 300 MIF (0.26N aqueous solution of tetramethyl ammonium hydroxide=TMAH) at 23° C. The developed resist images were inspected using Hitachi 54700 or AMRAY 4200L electron microscopes.

Imaging Results

Unexpectedly, a wide range of aqueous base soluble acrylic resins with dissolution rate ranging from 100 to 12,000 Å/sec in 0.26 aqueous TMAH coating films of these were found to be fully inhibited towards dissolution by adding a combination of a DNQ-PAC and Novolak resin to these coatings (Table 1-3). Moreover, these fully inhibited film, after exposure to UV light and photo-decomposition of the DNQ-PAC, could be well dissolved and when exposed with a photo-mask for L/S (line and space) features showed that these L/S features either showed no T-topping or top erosion or showed slight T-Topping and top erosion (Table 4).

Specifically, for examples, acrylate polymer P 1, this resin which had a very high aqueous base dissolution rate (12,000 Å/sec) when loaded with 78.4 wt % solids of Novolak 3 and 11.5 wt % solids DNQ PAC PW898 gave s dissolution rate of 0 Å/sec. Similarly, acrylate polymer P2 (dissolution rate 8,600 Å/sec) when loaded with 78.4 wt % solids Novolak 3 and 11.5 wt % solids DNQ PAC PW898) gave a dissolution rate of 0 Å/sec. Similarly, acrylate polymer P8 (dissolution rate 580 Å/sec) when loaded with 78.4 wt % solids Novolak 3 and 11.5 wt % solids DNQ PAC PW898) gave a dissolution rate of 0 Å/sec. Thus, acrylate polymers with dissolution rates of up to at last 12,000 Å/sec were found to be effectively dissolution inhibited by using a combination of a Novolak resin and a DNQ-PAC. content of acrylic resin to the total solid with 6.4% PAC loading, the film loss was up to 2060 Å/sec. However, For Polymer 8, when the loading is 50% solid content of acrylic resin to the total solid with the same PAC loading (6.4%), the film loss is to 0 Å/sec.

Formulation Example 16

2.83 g polymer of Synthesis Example 4, 25.35 g of Novolak resin CL23F resin, 5.94 g of diazonaphtoquinone-sulfonic ester [also called NK280], 0.024 g of 1H-1,2,4-triazole-3-thiol [also called 3-mercapto-1,2,4-triazole] and 0.023 g of APS-437 were dissolved in 65.83 g of PGMEA solvent to make a solution. The solution was filtered for tests.

Formulation Example 17

5.63 g polymer of Synthesis Example 4, 22.55 g of Novolak resin CL23F resin, 5.94 g of diazonaphtoquinone-sulfonic ester [also called NK280], 0.024 g of 1H-1,2,4-triazole-3-thiol [also called 3-mercapto-1,2,4-triazole] and 0.023 g of APS-437 were dissolved in 65.83 g of PGMEA solvent to make a solution. The solution was filtered for tests.

Formulation Example 18

8.46 g polymer of Synthesis Example 4, 19.72 g of Novolak resin CL23F resin, 5.94 g of diazonaphtoquinone-sulfonic ester [also called NK280], 0.024 g of 1H-1,2,4-triazole-3-thiol [also called 3-mercapto-1,2,4-triazole] and 0.023 g of APS-437 were dissolved in 65.83 g of PGMEA solvent to make a solution. The solution was filtered for tests.

Formulation Example 19

14.09 g polymer of Synthesis Example 4, 14.09 g of Novolak resin CL23F resin, 5.94 g of diazonaphtoquinone-sulfonic ester [also called NK280], 0.024 g of 1H-1,2,4-triazole-3-thiol [also called 3-mercapto-1,2,4-triazole] and 0.023 g of APS-437 were dissolved in 65.83 g of PGMEA solvent to make a solution. The solution was filtered for tests.

Formulation Example 20

22.55 g polymer of Synthesis Example 4, 5.66 g of Novolak resin CL23F resin, 5.94 g of diazonaphtoquinone-sulfonic ester [also called NK280], 0.024 g of 1H-1,2,4-triazole-3-thiol [also called 3-mercapto-1,2,4-triazole] and 0.023 g of APS-437 were dissolved in 65.83 g of PGMEA solvent to make a solution. The solution was filtered for tests.

Formulation Example 21

28.18 g polymer of Synthesis Example 4, 5.94 g of diazonaphtoquinonesulfonic ester [also called NK280], 0.024 g of 1H-1,2,4-triazole-3-thiol [also called 3-mercapto-1,2,4-triazole] and 0.023 g of APS-437 were dissolved in 65.83 g of PGMEA solvent to make a solution. The solution was filtered for tests.

Formulation Example 22

2.83 g polymer of Synthesis Example 4, 27.88 g of Novolak resin CL23F resin, 3.41 g of diazonaphtoquinone-sulfonic ester [also called NK280], 0.024 g of 1H-1,2,4-triazole-3-thiol [also called 3-mercapto-1,2,4-triazole] and 0.023 g of APS-437 were dissolved in 65.83 g of PGMEA solvent to make a solution. The solution was filtered for tests.

Formulation Example 23

2.83 g polymer of Synthesis Example 4, 28.56 g of Novolak resin CL23F resin, 2.73 g of diazonaphtoquinone-sulfonic ester [also called NK280], 0.024 g of 1H-1,2,4-triazole-3-thiol [also called 3-mercapto-1,2,4-triazole] and 0.023 g of APS-437 were dissolved in 65.83 g of PGMEA solvent to make a solution. The solution was filtered for tests.

Formulation Example 24

1.71 g polymer of CPR215, 26.85 g of Novolak resin CL23F resin, 5.56 g of diazonaphtoquinonesulfonic ester [also called NK280], 0.024 g of 1H-1,2,4-triazole-3-thiol [also called 3-mercapto-1,2,4-triazole] and 0.023 g of APS-437 were dissolved in 65.83 g of PGMEA solvent to make a solution. The solution was filtered for tests.

Formulation Example 25

1.71 g polymer of CPR215, 27.77 g of Novolak resin CL23F resin, 4.64 g of diazonaphtoquinonesulfonic ester

[also called NK280], 0.024 g of 1H-1,2,4-triazole-3-thiol [also called 3-mercapto-1,2,4-triazole] and 0.023 g of APS-437 were dissolved in 65.83 g of PGMEA solvent to make a solution. The solution was filtered for tests.

Formulation Example 26

1.71 g polymer of CPR215, 29.68 g of Novolak resin CL23F resin, 2.73 g of diazonaphtoquinonesulfonic ester [also called NK280], 0.024 g of 1H-1,2,4-triazole-3-thiol [also called 3-mercapto-1,2,4-triazole] and 0.023 g of APS-437 were dissolved in 65.83 g of PGMEA solvent to make a solution. The solution was filtered for tests.

Formulation Example 27 (CPR215 P11)

1.71 g polymer of CPR215, 27.77 g of Novolak resin CL23F resin, 4.64 g of diazonaphtoquinonesulfonic ester [also called NK280] and 0.023 g of APS-437 were dissolved in 65.83 g of PGMEA solvent to make a solution. The solution was filtered for tests.

TABLE 1

Dissolution rate of the formulations with varied PAC Loading

| Formulation examples | Novolak 3 (wt % solids) (type) | PAC (wt % solids) (type) | Acrylic resin (Polymer No: wt % solids) | Dissolution rate* (Å/sec) |
|---|---|---|---|---|
| 1 | 69.7 (Novolak 3) | 10.3 (Pw898) | P1: 20.0 | 20 |
| 1a | 78.4 (Novolak 3) | 11.5 (Pw898) | P1: 10.0 | 0 |
| 2 | 61.0 (Novolak 3) | 9.0 (Pw898) | P1: 30.0 | 62 |
| 3 | 43.6 (Novolak 3) | 6.4 (Pw898) | P1: 50.0 | 2060 |
| 4 | 26.2 (Novolak 3) | 3.8 (Pw898) | P1: 70.0 | 3750 |
| 5 | 69.7 (Novolak 3) | 10.3 (Pw898) | P2: 20.0 | 6 |
| 5a | 78.4 (Novolak 3) | 11.5 (Pw898) | P2: 10 | 0 |
| 6 | 61.0 (Novolak 3) | 9.0 (Pw898) | P2: 30.0 | 30 |
| 7 | 68.9 (Novolak 3) | 14.4 (NK280) | P2: 16.7 | 0 |
| 8 | 57.8 (Novolak 3) | 12.1 (NK280) | P8: 30.0 | 19 |
| 9 | 69.7 (Novolak 3) | 10.3 (Pw898) | P8: 20.0 | 0 |
| 10 | 61.0 (Novolak 3) | 9.0 (Pw898) | P8: 30.0 | 0 |
| 11 | 52.3 (Novolak 3) | 7.7 (Pw898) | P8: 40.0 | 0 |
| 12 | 43.6 (Novolak 3) | 6.4 (Pw898) | P8: 50.0 | 0 |
| 13 | 26.2 (Novolak 3) | 3.8 (Pw898) | P8: 70.0 | 484 |
| 14** | 87.9 (Novolak 3) | 12.1 (Pw898) | 0 | 0 |
| 15** | 82.7 (CL23F) | 17.3 (NK280) | 0 | 0 |

*Dissolution rate was measured by the film thickness change after 60 second develop in AZ 300MIF (a.k.a. 0.26N aqueous TMAH developer);
**Comparative Examples with no Acrylate Polymer.

TABLE 2

Dissolution rate of the formulation with P4 Acrylate Polymer and NK280 PAC

| Formulation examples | Novolak (wt % solids) | PAC NK280 (wt % solids) | Acrylic resin (Polymer P4: wt % solids) | Dissolution rate* (Å/sec) |
|---|---|---|---|---|
| 16 | 74.3 | 17.4 | 8.3 | 0 |
| 17 | 66.1 | 17.4 | 16.5 | 0 |
| 18 | 57.8 | 17.4 | 24.8 | 0 |
| 19 | 41.3 | 17.4 | 41.3 | 0 |
| 20 | 16.6 | 17.4 | 66.1 | 7 |
| 21** | 0 | 17.4 | 82.6 | 1090 |
| 22 | 81.59 | 9.98 | 8.28 | 0 |
| 23 | 83.58 | 7.99 | 8.28 | 0 |

*Dissolution rate was measured by the film thickness change after 60 second develop in AZ 300MIF developer (a.k.a. 0.26N TMAH in water)
**Comparative Example with no Novolak

TABLE 3

Dissolution rate of the formulation with P11 loading

| Formulation examples | Novolak (wt % solids) | PAC NK280 (wt % solids) | Acrylic resin (Polymer P11: wt % solids) | Dissolution rate* (Å/sec) |
|---|---|---|---|---|
| 24 | 78.58 | 5.56 | 5.00 | 0 |
| 25 | 81.27 | 4.64 | 5.00 | 0 |
| 26 | 86.87 | 2.73 | 5.00 | 0 |
| 27** | 81.33 | 4.64 | 5.00 | 0 |

*Dissolution rate was measured by the film thickness change after 60 second develop in AZ 300MIF developer (a.k.a. 0.26 N TMAH in water).
**Formulation does not contain MTA.

TABLE 4

CD Profile of the formulation with different Novolak/DNQ-PAC and Acrylate polymer loading

| Formulation examples | Novolak wt % solids (Novolak) | PAC wt % solids (DNQ-PAC) | Acrylic resin Acrylate Polymer: wt % solids | CD Profile 4 μm L/S | Resolution dose mJ/cm² |
|---|---|---|---|---|---|
| 1 | 69.7 (Novolak 3) | 10.2 (PW898) | P1:20 | Straight wall profiles No significant T-Top or Top loss on Cu or Si | 100 |
| 5 | 69.7 (Novolak 3) | 20 (PW898) | P2:10 | Straight wall profiles No significant T-Top or Top loss on Cu or Si | 300 |
| 11 | 52.2 (Novolak 3) | 7.68 (PW898) | P8:40 | Straight wall profiles No significant T-Top or Top loss on Cu or Si | 400 |
| 14** | 87.8 (Novolak 3) | (PW898) | 0 | Very Sloped profiles | 1000 |
| 16 | 74.4 (CL23F) | 17.4 (NK208) | P4:8.3 | Straight wall profiles Slight Top-loss on Cu or Si | 560 |
| 22 | 81.7 (CL23F) | 17.4 (NK208) | P4:8.3 | Straight wall profiles No significant T-Top or Top loss on Cu or Si | 400 |
| 23 | 83.7 (CL23F) | 17.4 (NK208) | P4:8.3 | Straight wall profiles Straight wall profiles Slight T-top on Cu or Si | 380 |
| 24 | 78.7 (CL23F) | 17.4 (NK208) | P11:5.0 | Straight wall profiles Slight Top-loss on Cu or Si | 500 |
| 25 | 81.4 (CL23F) | 17.4 (NK208) | P11:5.0 | Straight wall profiles No significant T-Top or Top loss on Cu or Si | 360 |
| 26 | 87.0 (CL23F) | 17.4 (NK208) | P11:5.0 | Straight wall profiles Slight T-top on Cu or Si | 200 |
| 27* | 81.4 (CL23F) | 17.4 (NK208) | P11:5.0 | Straight wall profiles No significant T-Top or Top loss | 360 |
| 15** | 82.7 (CL23F) | 17.4 (NK208) | 0 | Very sloped profiles | 300 |

*Formulation does not contain MTA;
***Comparative formulation not containing acrylate polymer As can be seen in Table 1, acrylate polymer P1 which had a very high dissolution rate in TMAH (12000 Å/sec) could be made to have no dark erosion if formulated with 69.7 wt % solids of Novolak 3 and 10.3 wt % solids of the PAC PW898 (Formulation Example 1a). Similarly, acrylate polymer P2 (dissolution rate 8600 Å/sec) could be made no dark erosion if formulated with 68.9 wt % solids of Novolak 3 and 16.7 wt % solids of the PAC PW898 (Formulation Example 5a). Acrylate polymer P8 which had a dissolution rate of 580 Å/sec no dark erosion with only 69.7 wt % solids of Novolak 3 and 10.3 wt % solids of PAC PW898 (Formulation Example 9). Similar results were observed with DNQ PAC NK280.

Table 2 shows dark erosion result which were obtained for Formulation Examples containing acrylate polymer P4 with different levels of DNQ PAC and Novolak. Resin P4 had an original dark erosion rate of 5500 Å/sec. In the Formulation Examples containing P4, keeping the DNQ PAC constant at 17.4 wt % solids and increasing the level the acrylate polymer up to 66.1 wt % solids only gave a very slight dark erosion of 7 Å/sec. Without the presence of the Novolak as seen in Comparative formulation 21 even with 17.4 wt % solids of the DNQ PAC a large Dark Erosion of 1090 Å/sec was observed. This demonstrated that when both the DNQ-PAC and the Novolak are added together to the acrylate polymer of this inventive composition they have an unexpected synergy in suppressing dark erosion on an acrylate polymer such as P4 which has a very high dark erosion rate in 0.26 N aqueous TMAH. Similarly, the Novolak component may be increase to a very larger extent up to at least 83.58 wt % solids and this synergistic resistance to dark erosion was maintained for Formulation Examples containing acrylate polymer with high dark erosion rates such as P4.

Table 3 shows the dissolution rates of Formulation Examples containing acrylate polymer P11, which had an initial dissolution rate of 135 Å/sec. No dark erosion was observed for this resin also, when various levels DNQ PAC and Novolak were added. Additionally, on exposure of coating of these Formulation Examples L/S images obtained with these Formulation Examples gave straight wall profiles unlike Formulation Examples which contained the Novolak and DNQ component without any acrylate polymer. Table 1 also shows that Formulation Example which containing only a Novolak and a DNQ-PAC also gave no Dark Erosion (Formulation Example 14 and 15). However, Formulation 14 and 15 unlike the inventive formulation gave L/S features when UV exposed under the same condition which were very sloped.

Table 4 shows the resolution dose for different 1/1 L/S features, and characteristic for various of the inventive formulation. All these formulations gave very steep sidewalls L/S features unlike standard Novolak formulation not containing an acrylate polymer component (Formulation Examples 14 and 15) which when exposed under similar conditions gave very sloped L/S features.

FIG. 1 shows a SEM comparison of 4 μm Line and Space (L/S) 1/1 features UV imaged with UV exposed resist film formed from formulation Examples 23, 22, 16 and 15, on a copper substrate. These results with Formulation Examples 23, 22 and 16 show that as the level of the DNQ-PAC (NK280) and Novolak (CL23F) was varied, keeping the acrylate polymer additive P4 constant step L/S sidewalls were maintained for all these inventive Formulations. In contrast, a comparative example which does not contain the acrylate polymer component (Formulation Example 15), processed in the same manner, shows L/S features which have very sloped profiles. Formulation Example 14, which was another formulation, with a different Novolak, but also excluded the acrylate component, also gave very sloped L/S feature. The acrylate polymer additive used in Formulation Examples 23, 22 and 16, P4, is an acrylate polymer additive which had very high dissolution rate of 5500 Å/s.

FIG. 2 shows a SEM comparison of 4 μm Line and Space (L/S) 1/1 features UV imaged with UV exposed resist film formed from formulation Examples 26, 25, and 24, on a silicon substrate. Formulation Examples 26, 25 and 24 showed again that when the levels of the DNQ-PAC (NK280) and Novolak (CL23F) were varied keeping the acrylate polymer additive P11 constant step L/S sidewalls were maintained for these to all these Formulations. The acrylate polymer additive used in Formulation Examples 26, 25, and 24, P11, was an acrylate polymer additive with a moderate dissolution rate of 135 Å/s.

Thus FIG. 1 and FIG. 2 show that a variety of acrylate polymer additives with different dissolution rate may be used in the inventive composition to achieve steep L/S sidewalls which cannot be achieved with standard Novolak formulations such as Formulation Examples 14 and 15 which do not contain the acrylate polymer component.

FIG. 3 shows a SEM comparison of 2 μm Line and Space (L/S) 1/1 features UV imaged with UV exposed resist film formed from formulation Examples 25, and 27, (containing the acrylate polymer component P11) on a copper substrate. These two Formulation are identical except one of them (Formulation Example 25) contains an optional heterocyclic thiol compound MTA: additive, (1H-1,2,4-triazole-3-thiol), while the other formulation (Formulation Example 27) does not. On copper substrates this heterocyclic thiol compound suppressed a slight footing in the L/S features which was seen for the L/S features obtained with Formulation Example 27. When Formulation 27, was imaged on another substrate, Si, there was no footing observed.

As with standard Novolak-DNQ photoresists, the disclosed inventive composition containing an acrylate polymer component, do not require a post exposure bake (PEB), and were found to be environmentally stable to a delay between exposure and development. However, the inventive compositions were found not to require a long rehydration which are typically required for standard Novolak resists [10-15 μm thick (20-30 min) ~5 μm thick (10 min)] not containing an acrylate polymer component, as in the inventive composition described herein. Further, the novel compositions were found to be able to image to at least L/S features with an aspect ratio of 5 to 6, which is better than what could be obtained with comparative Novolak resists which can only image L/S features with an aspect ratio of 3 to 4. Specifically, for instance, a film thickness of 4 μm the novel coated composition could resolve 0.65 μm L/S features (Aspect ratio: 6.15/1). Finally, the inventive compositions were also found to generally have UV sensitivities equal, or better than the comparative Standard Novolak resist formulations not containing an acrylate polymer component.

The invention claimed is:

1. A composition comprising components a), b), c) and d); wherein
component a) is an acrylic polymer comprising repeat units selected from ones having structure (1), (2), (3), (4), (5), (6), and (7) wherein these repeat units are present in said acrylic polymer in the following mole % ranges, based on the total moles of all different repeat units present, and further where the summation of the individual mole % values for all repeat units present in said polymer must equal 100 mole %, the repeat unit of structure (1) ranges from about 10 mole % to about 35 mole %, the repeat unit of structure (2) ranges from 0 mole % to about 20 mole %, the repeat unit of structure (3) ranges from about 0 mole % to about 55 mole %, the repeat unit of structure (4) ranges from about 0 mole % to about 30 mole %, the repeat unit of structure (5) ranges from about 15 mole % to about 55 mole %, the repeat unit of structure (6) ranges from about 0 mole % to about 40 mole %, the repeat unit of structure (7) ranges from about 0 mole % to about 25 mole %, $R_1$, $R_2$, $R_3$, $R_4$, $R_5$, $R_6$, and $R_7$ are individually selected from either H, F, a C-1 to C-4 perfluoroalkyl, or a C-1 to C-4 alkyl, $R_8$ and $R_9$ are individually selected from H, a C-1 to C-4 alkyl, a C-1 to C-4 alkyloxy alkyl, and a halogen, $R_{10}$ is a C-3 to C-8 cyclic alkyl, or a C-7 to C-14 alicyclic alkyl, $R_{11}$ is a C-2 to C-8 (hydroxy)alkylene moiety, $R_{12}$ is an acid cleavable group, $R_{13}$ is a C-3 to C-12, (alkyloxy)alkylene moiety, wherein said acrylic polymer are either acrylate polymers comprising structures (1), (3), (4) and (5), acrylate polymers comprising structures (1), (3), (5) and (7), or acrylate polymers comprising structures (1), (2), (5), and (6), wherein said acrylic polymer has a dissolution rate, of at least about 100 Å/sec and lower than about 13000 Å/sec in 0.26 N aqueous tetramethylammonium hydroxide (TMAH),

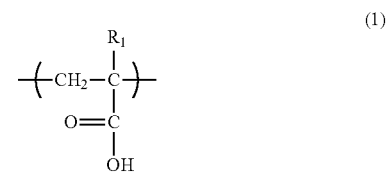

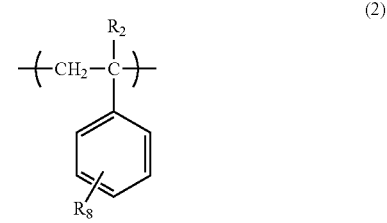

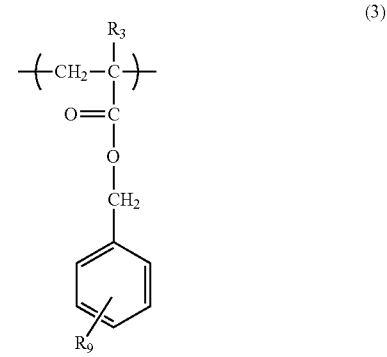

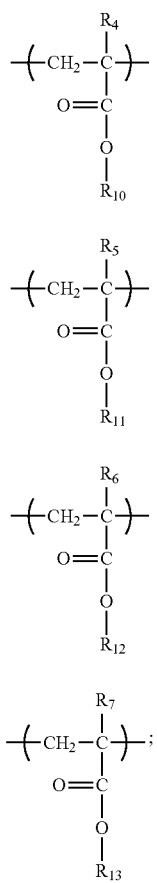

(4)

(5)

(6)

(7)

component b) is a Novolak resin having a dissolution rate in 0.26 N aqueous TMAH of at least 50 Å/sec;

component c) is a diazonaphthoquinone (DNQ) photoactive compound (PAC); and component d) is an organic spin casting solvent, and said acrylic polymer comprises about 0.5 wt % solids to about 70 wt % solids, and said DNQ PAC comprises about 5 wt % solids to about 20 wt % solids in said composition, and further wherein a coated film of said composition has a dark erosion less than 10 Å/sec in 0.26 N aqueous TMAH.

2. The composition of claim 1 wherein said acrylate polymer is one whose repeat units are the ones having structures (1), (3a), (4a) and (5a), wherein n is the number of methylene spacer moieties and ranges from an integer from 1 to 4, $R_1$, $R_3$, $R_4$, and $R_5$, are individually selected from a C-1 to C-4 alkyl, and $R_{5'}$ is selected from H and a C-1 to C-4 alkyl,

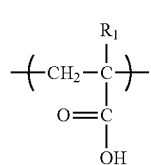

(1)

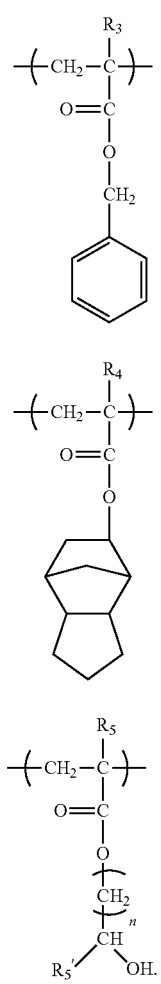

(3a)

(4a)

(5a)

3. The composition of claim 1, wherein said acrylate polymer is one whose repeat units are ones having structures (1), (3), (5) and (7), wherein $R_9$ is H.

4. The composition of claim 1, wherein said acrylate polymer is one whose repeat units, are ones having structures (1), (3a), (5a) and (7a), wherein n and n' are the numbers of methylene spacer moieties and range, independently, from 1 to 4, $R_1$, $R_3$, $R_5$, and $R_7$, individually, are selected from a C-1 to C-4 alkyl, $R_{5'}$ and $R_{7'}$ are individually selected from H or a C-1 to C-4 alkyl, and $R_{7''}$, is a C-1 to C-4 alkyl,

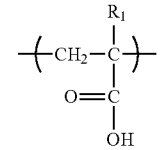

(1)

-continued (3a)

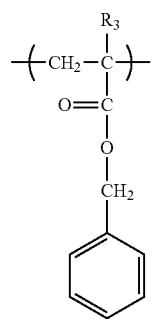

(5a)

(7a)

5. The composition of claim 1, wherein said acrylate polymer is one whose repeat units are ones having structures (1), (2a), (5a) and (6), wherein n is an integer number of methylene spacer moieties and ranges from 1 to 4, $R_1$, $R_5$, and $R_6$, are individually selected from a C-1 to C-4 alkyl, $R_{5'}$ is selected from H and a C-1 to C-4 alkyl, $R_8$ are individually selected from H, a C-1 to C-4 alkyl, $R_{12}$ is an acid cleavable protecting group selected from a C-4 to C-12 tertiary alkyl moiety having at least one beta hydrogen, an acetal moiety and a ketal moiety, (1)

(2a)

-continued (5a)

(6)

6. The composition of claim 1, wherein said Novolak resin comprises a repeat unit of structure (8), wherein, Ra, and Rb are independently a C-1 to C-4 alkyl, na is 0 to 3, nb is 0 or 1, 7. The composition of claim 1, wherein said Novolak resin comprises a repeat unit of structure (9), wherein, Rc, is a C-1 to C-4 alkyl, Rd is a C-1 to C-4 alkyl, X is —O—, $C(CH_3)_2$—, —(C=O)— or —$SO_2$—, nc is 0 to 3, nd is 0 or 1, (9)

8. The composition of claim 1, wherein the Novolak resin comprises from about 10 to about 90 wt % solids.

9. The composition of claim 1, wherein said DNQ PAC is a single material or a mixture of materials having general formula (10) wherein $D_{1c}$, $D_{2c}$, $D_{3c}$ and $D_{4c}$ are individually selected from H or a moiety having structure (11), and further wherein at least one of $D_{1c}$, $D_{2c}$, $D_{3c}$ or $D_{4c}$ is a moiety having structure (11), (10)

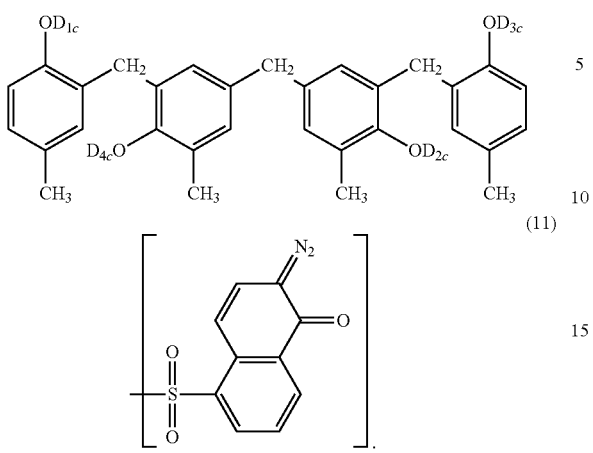

(11)

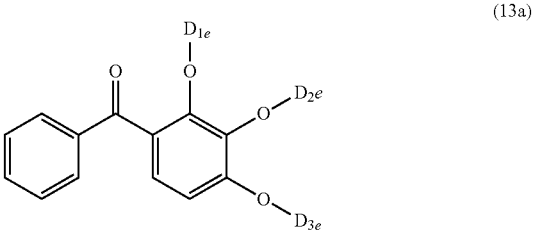

12. The composition of claim 1, wherein said DNQ PAC is either a single PAC compound or a mixture of PAC compounds having structure (13a), wherein $D_{1e}$, $D_{2e}$, $D_{3e}$ and $D_{4e}$ are individually selected from H or a moiety having structure (12), and further wherein at least one of $D_{1e}$, $D_{2e}$, or $D_{3e}$ is a moiety having structure (12),

10. The composition of claim 1, wherein said DNQ PAC is a single material or a mixture of materials having general formula (10) wherein $D_{1c}$, $D_{2c}$, $D_{3c}$ and $D_{4c}$ are individually selected from H or a moiety having structure (12), and further wherein at least one of $D_{1c}$, $D_{2c}$, $D_{3c}$ or $D_{4c}$ is a moiety having structure (12), (13a)

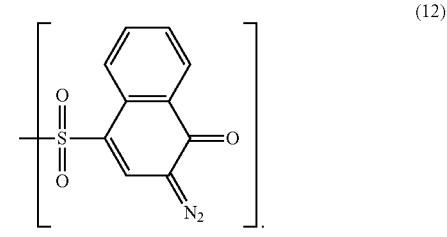

(10)

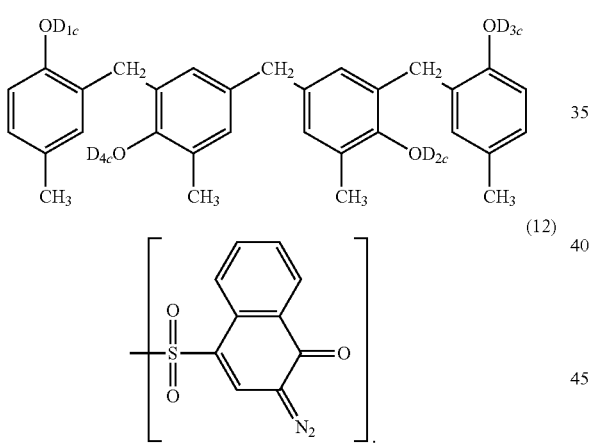

(12)

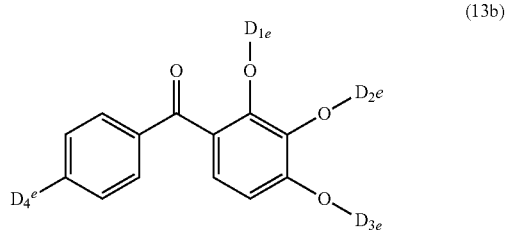

11. The composition of claim 1, wherein said DNQ PAC is either a single PAC compound or a mixture of PAC compounds having structure (13), wherein $D_{1e}$, $D_{2e}$, and $D_{3e}$ are individually selected from H or a moiety having structure (11), and further wherein at least one of $D_{1e}$, $D_{2e}$, or $D_{3e}$ is a moiety having structure (11),

13. The composition of claim 1, wherein said DNQ PAC is either a single PAC compound or a mixture of PAC compounds having structure (13b), wherein $D_{1e}$, $D_{2e}$, $D_{3e}$ and $D_{4e}$ are individually selected from H or a moiety having structure (11), and further wherein at least one of $D_{1e}$, $D_{2e}$, $D_{3e}$ or $D_{4e}$ is a moiety having structure (11), (13a)

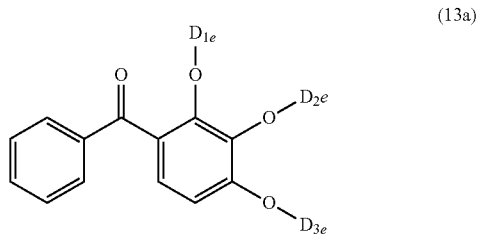

(13b)

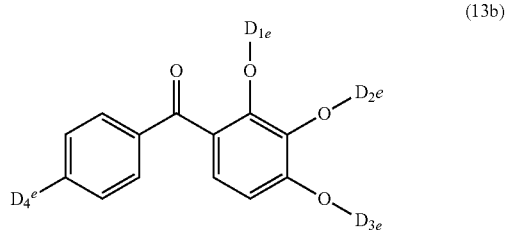

(11)

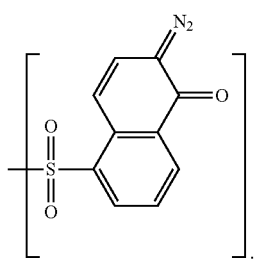

14. The composition of claim 1, wherein said DNQ PAC is either a single PAC compound or a mixture of PAC compounds having structure (13b), wherein $D_{1e}$, $D_{2e}$, $D_{3e}$ and $D_{4e}$ are individually selected from H or a moiety having structure (12), and further wherein at least one of $D_{1e}$, $D_{2e}$, $D_{3e}$ or $D_{4e}$ is a moiety having structure (12), (13b)

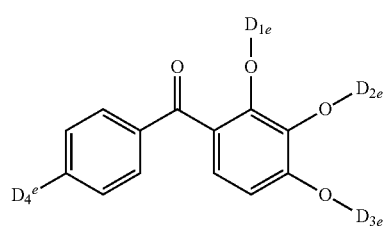

(12)

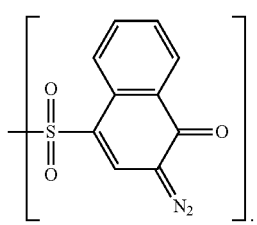

15. The composition of claim 1, wherein said DNQ PAC is either a single PAC compound or a mixture of PAC compounds having structure (14), wherein $D_{1f}$, $D_{2f}$, $D_{3f}$ and $D_{4f}$ are individually selected from H or a moiety having structure (11), and further wherein at least one of $D_{1f}$, $D_{2f}$, $D_{3f}$ and $D_{4f}$ is a moiety having structure (11), (14)

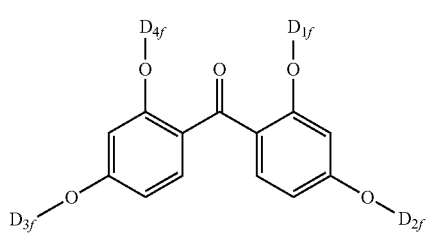

(11)

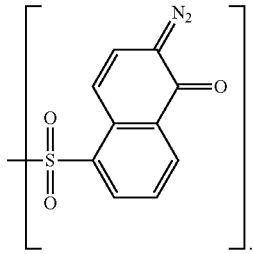

16. The composition of claim 1, wherein said DNQ PAC is either a single PAC compound or a mixture of PAC compounds having structure (14), wherein $D_{1f}$, $D_{2f}$, $D_{3f}$ and $D_{4f}$ are individually selected from H or a moiety having structure (12), and further wherein at least one of $D_{1f}$, $D_{2f}$, $D_{3f}$ and $D_{4f}$ is a moiety having structure (12), (14)

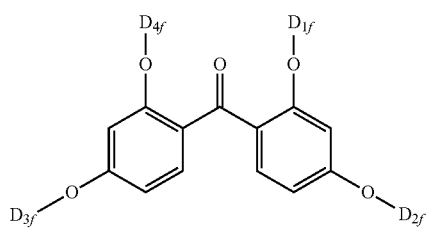

(12)

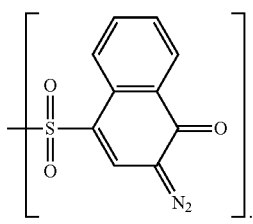

17. The composition of claim 1, wherein the diazonaphthoquinone (DNQ) photoactive compound ranges from about 5 to about 20 wt % of the photoresist composition.

18. The composition of claim 1, wherein said composition further comprises component e) at least one heterocyclic thiol compound comprising a ring structure chosen from the general structures (15), (16) or (17), or tautomers thereof; and (15)

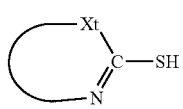

(16)

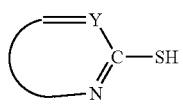

(17)

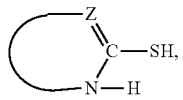

wherein, said ring structure is a single ring structure having from 4 to 8 atoms, or a multi ring structure having from 5 to 20 atoms; and wherein the single ring structure, or the multi ring structure comprises an aromatic, non-aromatic, or heteroaromatic ring, and in said structure (15), Xt is selected from the group consisting of $C(Rt_1)(Rt_2)$, O, S, Se, and Te;

in said structure (16), Y is selected from the group consisting of $C(Rt_3)$ and N;

in said structure (17), Z is selected from the group consisting of $C(Rt_3)$ and N; and $Rt_1$, $Rt_2$, and $Rt_3$ are independently selected from the group consisting of H, a substituted alkyl group having 1 to 8 carbon atoms, an unsubstituted alkyl group having 1 to 8 carbon atoms, a substituted alkenyl group having 2 to 8 carbon atoms, unsubstituted alkenyl group having 2 to 8 carbon atoms, a substituted alkynyl group having 2 to 8 carbon atoms, unsubstituted alkynyl group having 2 to 8 carbon atoms, a substituted aromatic group having 6 to 20 carbon atoms, a substituted heteroaromatic group having 3 to 20 carbon atoms, unsubstituted aromatic group having 6 to 20 carbon atoms and unsubstituted heteroaromatic group having 3 to 20 carbon atoms.

19. A process comprising steps i) to iv), i) coating the composition of claim 1 to form a coating, ii) baking said coating to form a baked coating, iii) exposing said baked coating with radiation through a mask a coating with an exposed pattern, iv) developing said exposed pattern with an aqueous base developer removing areas of said pattern exposed to said radiation forming a photoresist positive image.

\* \* \* \* \*